(12) United States Patent
Jang et al.

(10) Patent No.: US 8,368,106 B2
(45) Date of Patent: Feb. 5, 2013

(54) GRADIENT COMPOSITE MATERIAL AND METHOD OF MANUFACTURING THE SAME

(75) Inventors: Guang-Way Jang, Hsinchu (TW); Ying-Chih Pu, Tainan (TW); Yin-Ju Yang, Hsinchu (TW); Chang-Ming Wong, Zhubei (TW); Chih-Fen Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 34 days.

(21) Appl. No.: 12/939,800

(22) Filed: Nov. 4, 2010

(65) Prior Publication Data
US 2012/0112219 A1  May 10, 2012

(51) Int. Cl.
*H01L 33/00* (2010.01)
*H01L 21/00* (2006.01)
(52) U.S. Cl. .......................... 257/98; 438/800
(58) Field of Classification Search .................. None
See application file for complete search history.

(56) References Cited

U.S. PATENT DOCUMENTS

| 6,236,493 | B1 | 5/2001 | Schmidt et al. | |
| 2005/0059760 | A1* | 3/2005 | Dellwo et al. | 524/409 |
| 2006/0128874 | A1 | 6/2006 | Farooq et al. | |
| 2008/0081264 | A1* | 4/2008 | Mennig et al. | 430/2 |
| 2009/0131571 | A1 | 5/2009 | Fraser et al. | |

FOREIGN PATENT DOCUMENTS

TW 98114904 5/2009

OTHER PUBLICATIONS

English language translation of abstract of TW 98114904 (published May 5, 2009).

* cited by examiner

*Primary Examiner* — Scott B. Geyer
(74) *Attorney, Agent, or Firm* — McClure, Qualey & Rodack, LLP

(57) ABSTRACT

Method of manufacturing gradient composite material comprises steps of providing plural surface modified inorganic nanoparticles with functional groups or oligomers with functional groups; transferring the surface modified inorganic nanoparticles or oligomers with functional groups into an organic matrix to form a mixture; performing a photo polymerization step or a thermo-polymerization step for polymerizing and generating a gradient distribution of the surface modified inorganic nanoparticles or oligomers with functional groups in the mixture; and curing the mixture to solidify the organic matrix and form a structure with gradient composite, wherein the organic matrix is transferred into an organic polymer after curing.

42 Claims, 11 Drawing Sheets resin layer 1'- refraction index of 1.5
resin layer 2' - refraction index of 1.5
resin layer 3' - refraction index of 1.5 resin layer 1'- refraction index of 1.55
resin layer 2' - refraction index of 1.55
resin layer 3' - refraction index of 1.55 resin layer 1'- refraction index of 1.5
resin layer 2' - refraction index of 1.55
resin layer 3' - refraction index of 1.62

GRADIENT COMPOSITE MATERIAL AND METHOD OF MANUFACTURING THE SAME

BACKGROUND

1. Field of the Invention

The disclosure relates in general to a composite material and method of manufacturing the same, and more particularly to a gradient composite material and method of manufacturing the same.

2. Description of the Related Art

Plastic sheet, formed by injection molding or cell casting, can produce a variety of objects by different thermoplastic, thermosetting, and photocuring methods. Those plastic materials are further subjected to surface treatment, such as the secondary processing, to meet the requirements of the physical/chemical properties of the objects (such as wear resistance, electrical conductivity, thermal conductivity, anti-fouling etc.). However, the secondary processing would increase the cost and cause the problem of interface compatibility, such as adhesion or coefficient of thermal expansion (CTE) difference, etc. Typically, the inorganic materials, such as metals, ceramics, metal oxides and alloys, are used for improving or changing the physical properties of the surface of the plastic materials. However, large amounts of the inorganic materials added into the resin would increase the viscosity of the resin, which is unfavorably condition to the resin storage and processing. Also, the products (sheets or coating films) made of this resin with large amounts of the inorganic materials would be easy to crack or cause aggregation of inorganic particles, so as to affect the optical properties of the finished products.

It is desired to develop a material containing an organic base (ex: resin) and small amounts of the inorganic materials or other organic materials to possess the advantageous properties, including easy to store and process, not easy to crack, no aggregation of inorganic particles during storage stage or in the resin, and the surface properties of the finished products being improved.

Take an optical device fabrication for example. In order to increasing the light extraction efficiency of the optical device, a material is sandwiched between the lighting device and the air, wherein the refraction index of the material is in the range between the refraction indexes of the lighting device and the air. FIG. 1 simply depicts a conventional optical device with one layer of resin. Generally, the refraction index of the LED 11 is 2.5~3.5 while the refraction index of the air 15 is 1. A total internal reflection occurs at the interface of the LED 11 and the air 15 due to the difference between the refraction indexes of the LED 11 and the air 15. Recently, the resin 13 used for encapsulating the LED 11 has a refraction index (RI) in the range of 1.4-1.5. Some special material of resin may possess a higher refraction index of about 1.6. Although the resin with high refraction index could increase the light extraction between the LED 11 and the resin 13, the difference between the refraction indexes of the resin 13 and the air 15 still exists. If the resin 13 for encapsulating the LED 11 could be designed to have a gradient refraction index, which the resin portion close to the LED 11 has higher refraction index and other portion close to the air 15 has lower refraction index, the total internal reflection would be prevented so as to effectively increase the light extraction efficiency.

Recently, the encapsulating structure with gradient refraction index applied in the optical device is achieved by laminating several molding layers with different refraction indexes, and the molding layers are arranged in an order of higher value to lower value of refraction index. FIG. 2 simply depicts another conventional optical device, having three resin layers with different refraction index for encapsulating an LED. As shown in FIG. 2, the resin layers 22-25 with different refraction indexes are orderly formed on the chip 21. The order of the refraction index of the resin layers 22-25 is n1>n2>n3>n4 (measured along the line 27). However, it is time-consuming and highly cost for fabricating the optical device with several resin layers as shown in FIG. 2. Also, it is likely to cause defects between the interfaces of the resin layers, leading to light scattering.

Moreover, in the application of display screen, the conventional optical glass is expansive, difficult to fabricate and increasing the overall weight of the finished product. Plastic sheet could be an alternative choice. Adding inorganic compounds into the plastic may increase the rigidness and hardness. However, the added contents of inorganic compounds for reaching the hardness requirement of the cover of the touch screen would degrade the ability of deformation of plastic, so that make the plastic material easy to fragile when it is subjected to pressure.

SUMMARY

In the disclosure, the composite material containing small amounts of inorganic compounds with surface modification is used. Before completely solidifying the composite material, the surface modified inorganic compounds (ex: nanoparticles) with functional groups or oligomers with functional groups are induced to the irradiated surface of the composite material using photo-polymerization, so as to improve the physical property of the surface and form a structure with gradient distribution. This disclosure is also applicable to the functional organic composition, for decreasing the amounts of functional material(s). Fabrication of cover sheet of display screen is one of applications capable of adopting the technique of the disclosure.

The present disclosure is related to a gradient composite material and method of manufacturing the same. In the embodiments of the present disclosure, an organic-inorganic mixture could be formed by transferring the surface modified inorganic nanoparticles with functional groups into the organic matrix. Alternatively, an organic mixture could be formed by transferring the oligomers with functional groups into the organic matrix. Then, the nanoparticles or oligomers with functional groups are induced to the surface of the composite material using photo-polymerization or thermo-polymerization. Finally, the whole composite material is cured by thermo-polymerization or photo-polymerization.

According to the first aspect of the present disclosure, a method of manufacturing gradient composite material is provided. First, plural surface modified inorganic nanoparticles with functional groups or oligomers with functional groups are provided. The surface modified inorganic nanoparticles comprises at least one kind of metal oxide nanoparticles, metal nanoparticles and semiconductor nanoparticles, and the nanoparticle material selection depends on the practical application. Then, the surface modified inorganic nanoparticles or oligomers with functional groups are transferred into an organic matrix to form a mixture. Next, the mixture is performed by a photo polymerization step (ex: irradiated with a light source) or a thermo-polymerization step for polymerizing and generating a gradient distribution of the surface modified inorganic nanoparticles or oligomers with functional groups in the mixture. Then, the mixture is cured to solidify the organic matrix and form a structure with gradient composite, wherein the organic matrix is transferred into an organic polymer after curing.

The metal oxide nanoparticles could be represented as $M_xO_y$. Examples of the metal oxide nanoparticles include titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminum oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum(III) oxide ($La_2O_3$), vanadium(V) oxide ($V_2O_5$), molybdenum(VI) oxide ($MoO_3$) and tungsten(VI) oxide ($WO_3$). Examples of the inorganic metal nanoparticles include Cu, Ag, Au, Ni, Fe and Co. The inorganic semiconductor nanoparticles comprises plural core-shell nanoparticles, each having metal oxide shell surrounding the core. Also, the cores could be used solely, as the inorganic nanoparticles. Examples of the core include CdSe, $Cd_xZn_{1-x}Se$ (0.01 x 0.99), $Cd_xZn_{1-x}S$ (0.01 x 0.99), $Cd_xZn_{1-x}S_ySe_{1-y}$ (0.01 x 0.99 and 0.01 y 0.99), CdSe—ZnS, CdSe—CdTe, CdTe, CdS, CdS—ZnS, CdSe—CdTe—ZnSe, ZnS, ZnTe, PbS, PbSe, PbTe, ZnO, and Si. Examples of the metal oxide shell material are the same as aforesaid metal oxide nanoparticles.

In the packaging applications of optical device (ex: LED package), the inorganic semiconductor nanoparticles could be selected, but not limited, as the nanoparticles for manufacturing a structure with gradient refraction index. In the applications of manufacturing a structure with increased hardness at one side, the inorganic metal oxide nanoparticles could be selected, but not limited, as the nanoparticles for fabrication. In the applications of manufacturing a structure with improved conductivity at one side, the metal or metal oxide nanoparticles could be selected, but not limited, as the nanoparticles for fabrication.

According to the second aspect of the present disclosure, a structure with gradient composite material is provided, comprising a solid organic polymer and a plurality of surface modified inorganic nanoparticles with functional groups or oligomers with functional groups distributed in the solid organic polymer. The polymerization rate of the surface modified inorganic nanoparticles or oligomers with function group is higher than the polymerization rate of the monomer of the organic matrix under a gradient step, and presents a gradient distribution in the solid organic polymer. The surface modified inorganic nanoparticles could comprise plural nanoparticles with the same or different concentrations of the functional groups. If the surface modified inorganic nanoparticles with different concentration of functional groups are selected for use, the surface modified inorganic nanoparticles with higher concentration of functional groups have the larger tendency of aggregation.

According to the third aspect of the present disclosure, a package is provided, at least comprising a light source and a molding compound encapsulating the light source, wherein the light source is disposed in a bottom portion of the molding compound. The molding compound comprises a solid organic polymer (polymerized from an organic matrix) and a plurality of surface modified inorganic nanoparticles with functional groups or oligomers with functional groups distributed in the solid organic polymer. The surface modified inorganic nanoparticles with functional groups or oligomers with functional groups are distributed from the bottom portion to a top portion of the molding compound, so that the molding compound presents a gradient refraction index, wherein the surface modified inorganic nanoparticles with functional groups or oligomers with functional groups have higher polymerization rate than the organic matrix under a gradient-generating step. The surface modified inorganic nanoparticles could comprise plural nanoparticles with the same or different concentrations of the functional groups.

According to the fourth aspect of the present disclosure, a substrate with composite material is provided. The substrate with composite material has a first surface and a second surface disposed opposite. The substrate at least comprises an acrylic polymer or an polyepoxide, polymerized from an acrylic matrix or an epoxide matrix, and a plurality of surface modified inorganic nanoparticles with functional groups or oligomers with functional groups distributed in the acrylic polymer or the polyepoxide and further presenting a gradient distribution. The surface modified inorganic nanoparticles could comprise plural nanoparticles with the same or different concentrations of the functional groups. The acrylic polymer or the polyepoxide has a concentrating sub-area and a diffusing sub-area, relatively close to the first surface and the second surface, respectively. The surface modified inorganic nanoparticles comprises at least one kind of metal oxide nanoparticles, metal nanoparticles and semiconductor nanoparticles; and more surface modified inorganic nanoparticles or oligomers with functional groups are distributed in the concentrating sub-area than in the diffusing sub-area, wherein the surface modified inorganic nanoparticles with functional groups or oligomers with functional groups have higher polymerization rate than the acrylic matrix under a gradient step.

The disclosure will become apparent from the following detailed description of the preferred but non-limiting embodiments. The following description is made with reference to the accompanying drawings.

DETAILED DESCRIPTION

The present disclosure is related to a gradient composite material and method of manufacturing the same. In the embodiments of the present disclosure, an organic-inorganic mixture could be formed by transferring the surface modified inorganic nanoparticles with functional groups into the organic matrix. Alternatively, an organic mixture could be formed by transferring the oligomers with functional groups into the organic matrix. Then, the surface modified inorganic nanoparticles or oligomers with functional groups are induced to the surface of the composite material by a gradient step (including photo-polymerization or thermo-polymerization). Finally, the whole composite material is cured by thermo-polymerization or photo-polymerization.

Figure 3:
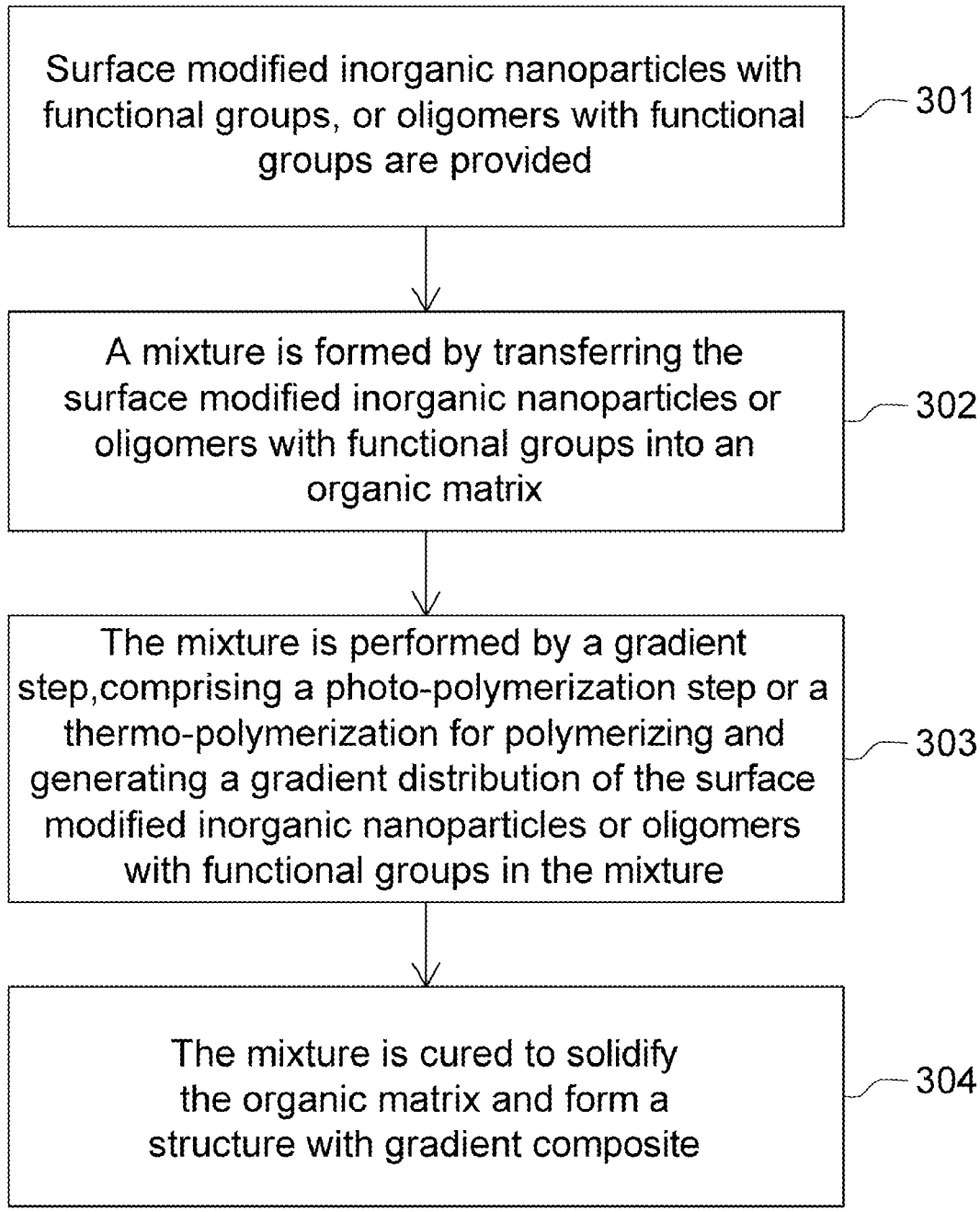
FIG. 3 depicts a method of manufacturing the gradient composite material according to the embodiment of the disclosure.

FIG. 3 depicts a method of manufacturing the gradient composite material according to the embodiment of the disclosure. First, plural surface modified inorganic nanoparticles with functional groups, or oligomers with functional groups are provided, as shown in step 301. In the embodiment, the surface modified inorganic nanoparticles comprises at least one kind of metal oxide nanoparticles, metal nanoparticles and semiconductor nanoparticles, and the nanoparticle material selection depends on the practical application. Also, the surface modified inorganic nanoparticles or oligomers of the embodiments could have the same number (concentration) of the functional groups, or the different numbers (concentrations) of the functional groups.

In an embodiment, metal oxides nanoparticles with functional groups can be selected from the group consisting of titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminium oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum(III) oxide ($La_2O_3$), vanadium(V) oxide ($V_2O_5$), molybdenum(VI) oxide ($MoO_3$) and tungsten(VI) oxide ($WO_3$). In another embodiment, the inorganic metal nanoparticles could be Cu, Ag, Au, Ni, Fe or Co. In another embodiment, the surface modified inorganic nanoparticles could be plural core-shell nanoparticles, each having metal oxide shell surrounding the core. Also, the cores could be used solely, as the inorganic nanoparticles. Material examples of the metal oxide shell are presented above. Examples of the core material includes CdSe, $Cd_xZn_{1-x}Se$ (0.01 x 0.99), $Cd_xZn_{1-x}S$ (0.01 x 0.99), $Cd_xZn_{1-x}S_ySe_{1-y}$ (0.01 x 0.99 and 0.01 y 0.99), CdSe—ZnS, CdSe—CdTe, CdTe, CdS, CdS—ZnS, CdSe—CdTe—ZnSe, ZnS, ZnTe, PbS, PbSe, PbTe, ZnO, and Si. Examples of the metal oxide shell material are the same as aforesaid metal oxide nanoparticles.

The nanoparticle material selection depends on the practical application. When the disclosure is applied to a package with a molding compound encapsulating a light source, particularly a light emitting diode, the inorganic semiconductor nanoparticles could be selected, but not limited, as the nanoparticles for manufacturing a structure with gradient refraction index; for example, the metal oxide—Quantum dot core-shell nanoparticles with functional groups can be selected for the application. The metal oxide—Quantum dot core-shell nanoparticle includes a metal oxide shell and a core, and the material examples are listed above. When the disclosure is applied to manufacture a structure with increased hardness at one side, the inorganic metal oxide nanoparticles could be selected, but not limited, as the nanoparticles for fabrication.

When the disclosure is applied to manufacture a structure with improved conductivity at one side, the metal or metal oxide nanoparticles could be selected, but not limited, as the nanoparticles for fabrication.

Then, a mixture is formed by transferring the surface modified inorganic nanoparticles or oligomers with functional groups into an organic matrix, as shown in step 302. If the surface modified inorganic nanoparticles is mixed with the organic matrix, an organic-inorganic mixture is formed. If the oligomers with functional groups is mixed with the organic matrix, an organic mixture is formed.

Next, the mixture is performed by a photo polymerization step (ex: irradiated with a light source) or a thermo-polymerization step for polymerizing and generating a gradient distribution of the surface modified inorganic nanoparticles or oligomers with functional groups in the mixture, as shown in step 303. The surface modified inorganic nanoparticles or oligomers with functional groups had higher polymerization rate than the monomer of the organic matrix under the gradient step, for example, the photocuring process. During the photocuring process, the polymerization rate of the monomer of the organic matrix is slower than the polymerization rate of the surface modified inorganic nanoparticles or oligomers with functional group, the surface modified inorganic nanoparticles or oligomers with functional group can be diffused within the organic matrix under the photocuring process, so as to present a gradient distribution.

Moreover, according to Colburn-Haines Effect, the rate of polymerization is directly proportional to the numbers of monomer functional groups. The polymerization rate of the nanoparticles with higher concentration of the functional groups on the surface thereof or oligomers with more functional groups is faster than that of the nanoparticles with lower concentration of the functional groups on the surface thereof or oligomers with less functional groups. If the nanoparticles or oligomers with different concentration of the functional groups are selected as the surface modified inorganic nanoparticles or oligomers in an embodiment, the portion closer to the light source has higher concentration of the surface modified inorganic nanoparticles or oligomers with functional groups, while the portion further from the light source has lower concentration of the surface modified inorganic nanoparticles or oligomers with functional groups after the photocuring process. Thus, a gradient distribution is created. In an embodiment, a photo-initiator can be further added into the mixture before conducting the photo-polymerization step (ex: irradiation of light). The photo-initiator could be adequately selected according to the wavelength of the light source. For example, when the wavelength of the light source is ranged from 300 nm-380 nm, the photo-initiator could be selected from (but not limited to) one of diphenyl(2,4,6-trimethylbenzoyl)phosphine oxide (TPO), 2-Hydroxy-2-Methyl-1-phenyl-1-Porpanone or 1-hydroxy cyclohexyl phenyl ketone, Phosphine oxide and phenyl bis(2,4,6-trimethyl benzoyl). In another embodiment, a thermo-polymerization step could also be used for polymerizing and generating a gradient distribution of the surface modified inorganic nanoparticles or oligomers with functional groups in the mixture.

Afterward, the mixture is cured to solidify the organic matrix and form a structure with gradient composite, as shown in step 304. In an embodiment, a curing (/hardening) agent can be further added into the mixture before curing the mixture to solidify the organic matrix, wherein the organic matrix is transferred into an organic polymer. Examples of the curing (/hardening) agent include methyl hexahydrophthalic anhydride (MHHPA), 2,2'-Azobisisobutyronitrile (AIBN) and Benzoyl peroxide (BPO).

The organic matrix of the mixture could be oligomers with multi-functional groups, monomers with multi-functional groups, monomers with two functional groups or single functional group, or a combination thereof.

In an embodiment, examples of the oligomers with functional groups include the urethane acrylate oligomers (i.e. the functional groups of the oligomers are acrylate functional groups), which are represented by compound O1 or compound O2:

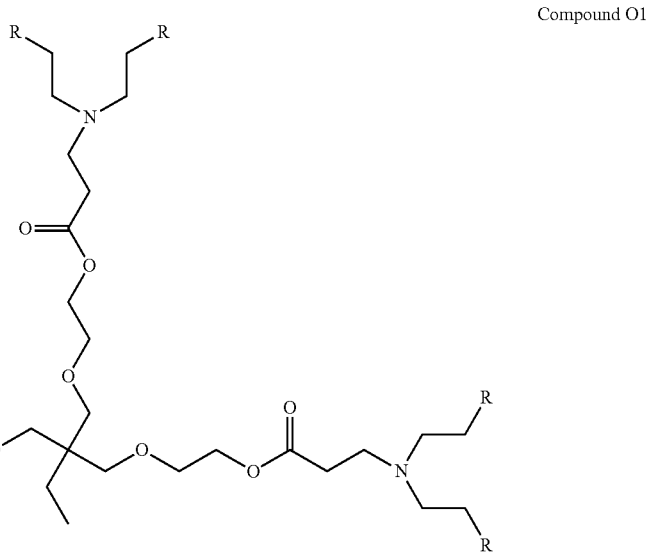

Compound O1

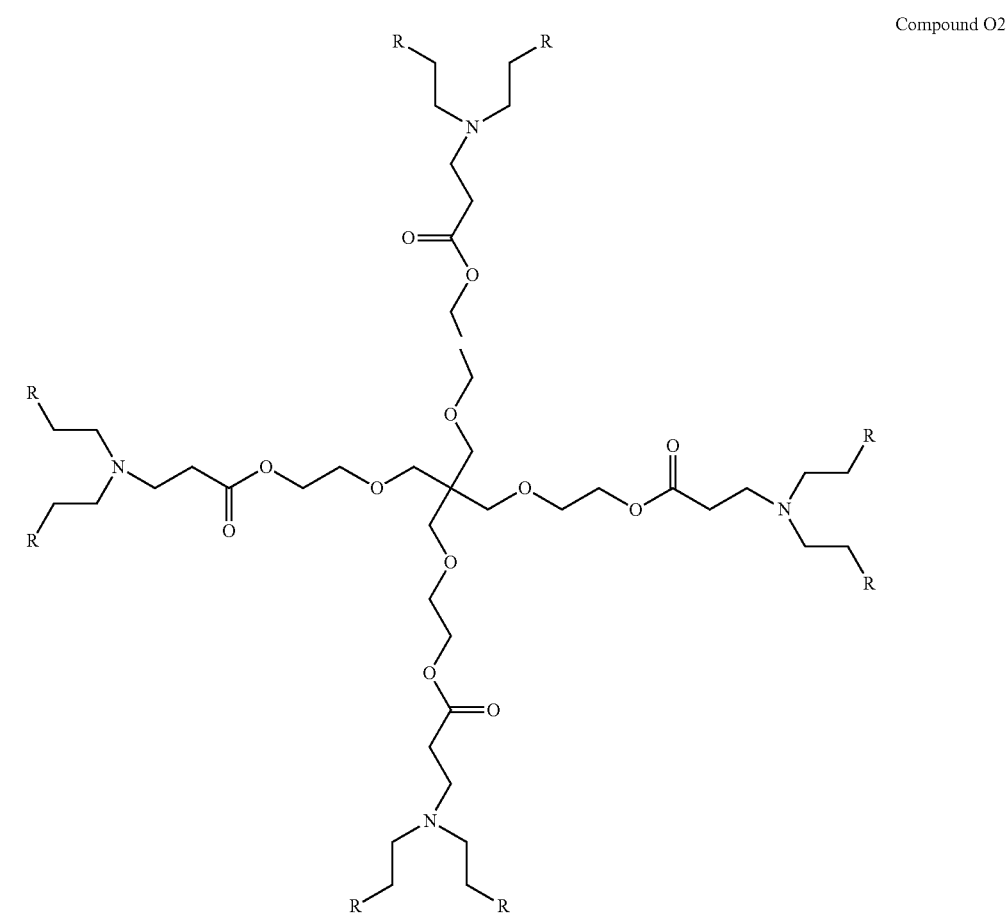

Compound O2 wherein:

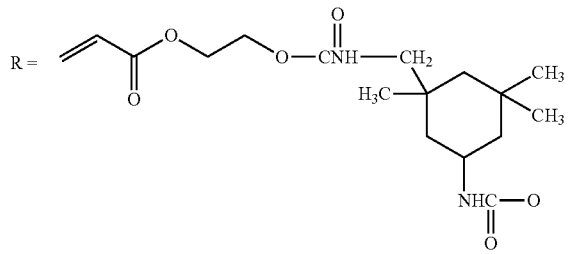

In an embodiment, the organic matrix, mixed with the surface modified inorganic nanoparticles or oligomers with functional groups, could be selected from one or more of the oligomers with multi-functional groups, acrylic monomers with multi-functional groups, acrylic monomers with two functional groups and acrylic monomers with single functional group.

Example of the acrylic monomer with single functional group includes methyl methacrylate (MMA).

(MMA)

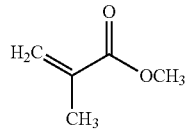

Examples of the acrylic monomer with two functional groups include ethoxylated bisphenol-A diacrylate (BPA4EODA), ethoxylated bisphenol-A diacrylate (BPA3EODA) and 1,6-Hexanediol Diacrylate (HDDA).

Examples of the acrylic monomer with three functional groups include pentaerythritol triacrylate (PET3A) and trimethylolpropane triacrylate (TMPTA).

(PET3A)

(TMPTA)

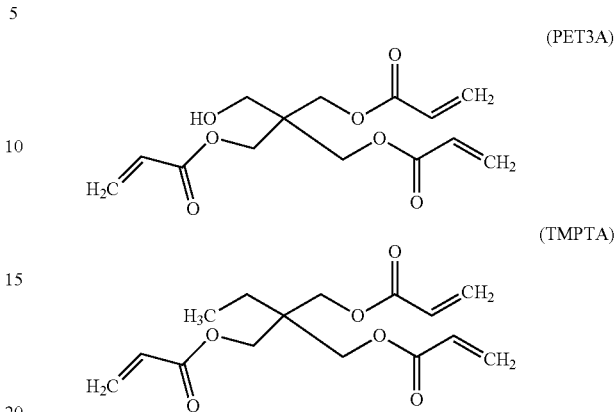

Example of the acrylic monomer with six functional groups includes Dipentaerythritol Hexaacrylate (DPHA).

(DPHA)

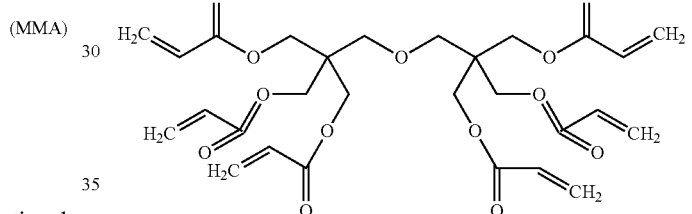

According to the embodiment, the inorganic nanoparticles with photochemically polymerizable functional groups on (BPA4EODA)

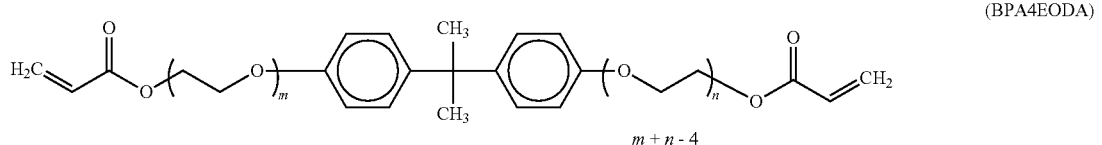

$m + n = 4$ (BPA3EODA)

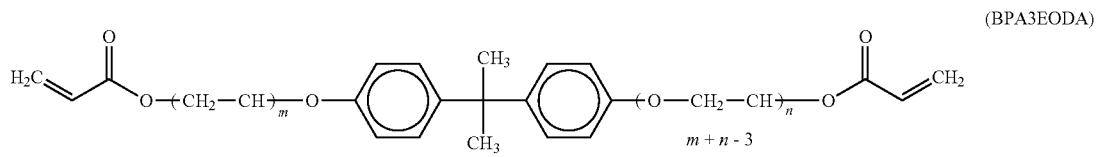

$m + n = 3$ (HDDA)

the surfaces for modification, or oligomers with functional groups are provided first. The surface modified inorganic nanoparticles or oligomers with functional groups are then transferred into an organic matrix to form a mixture, and the mixture is then subjected to the photo-polymerization. The ratios of photo-polymerizable functional groups on the surfaces of the inorganic nanoparticles or the numbers of functional groups of oligomers have effect on the rate of polymerization. The more photo-polymerizable functional groups on the surfaces of the inorganic nanoparticles, the faster the rate of polymerization. During the photo-polymerization, the nanoparticles or oligomers with faster rate of polymerization are quickly polymerized and moved toward the direction of the light source due to the light effect. Accordingly, there is a gradient distribution related to the concentration of the functional groups of the nanoparticles or oligomers after photo-polymerization. If there is a refraction index differences between the inorganic nanoparticles and the organic matrix, a gradient refraction index can be created after photo-polymerization (and/or thermo-polymerization) is performed. If there is a hardness/electro-conductivity/thermo-conductivity differences between the inorganic nanoparticles (or the oligomers) and the organic matrix (ex: thermo-polymerization), a gradient distribution can be created and different hardness/electro-conductivity/thermo-conductivity of the opposite surfaces of the material can be presented after photo-polymerization (and/or thermo-polymerization) is performed.

Accordingly, the disclosure can be widely used in many applications, such as a thin film/sheet fabrication, a device package fabrication, an optical device fabrication and etc. Take a light emitting diode (LED) package fabrication for example. The refraction index of the molding compound can be increased by adding the inorganic material into the organic matrix. If the light source is disposed under the polymer, i.e. disposed in the bottom of the package, the higher concentrations of the surface modified inorganic nanoparticles aggregate at the place closer to the light source after photo-polymerization, so that a gradient concentration distribution is formed. Thus, a gradient refraction index could be also created due to the refraction index differences between the inorganic and organic materials, thereby improving the light efficiency of the device package.

Take a display fabrication for another example. Since the transparent conductive film is well developed in the recent years, the touch screens adopted in 3C electronic communication related products have become a trend. Besides the transparent conductive film, the optical glass for covering the touch screen is also one of the key components of the display. For meeting the requirements of individual specifications, the optical glass for covering the touch screen may need to be thinned down by grinding, or configured as a 3D structure with certain curvature. However, it is time-consuming and highly cost for grinding or configuring the optical glass. Besides the optical glass, the plastic material has been used for making a 3D structure with certain curvature to be the cover of the touch screen recently. The plastic material has property of good modeling, but not rigid enough for being a good cover of the touch screen. Adding inorganic compounds into the plastic may increase the rigidity and hardness. However, the added contents of inorganic compounds for reaching the hardness requirement of the cover of the touch screen would degrade the ability of deformation of plastic, so that make the material easy to fragile when it is subjected to pressure. If the optical glass is substituted by the composite material manufactured according to the embodiment of the disclosure, the composite material contains small amounts of inorganic compounds and has a gradient distribution and different hardness at opposite surfaces; therefore, the touch surface of the screen presents a hard and cold texture, and also good tenacity in a whole piece. Compared to the conventional optical glass for making the cover of the touch screen, the composite material manufactured according to the embodiment of the disclosure not only simplifies the fabricating process but also decreases the cost, which is a highly competitive material in the applications of display screen.

The embodiments are provided to demonstrate the disclosure in details. The illustrations mainly divided into two parts—(1) composite material with gradient refraction index and method of manufacturing the same, and (2) composite material with gradient distribution and different properties at opposite surfaces (such as properties of hardness, thermo-conductivity, electro-conductivity, hydrophilic and hydrophobic, morphology . . . ) and method of manufacturing the same. Also, the embodiments are described with reference to the related experiments. However, the compounds, materials and steps for providing illustrations in the embodiments or experiments are not intended to limit the invention. The modifications and variations can be made without departing from the spirit of the disclosure to meet the requirements of the practical applications.

<Composite Material with Gradient Refraction Index and Method of Manufacturing the Same>

Figure 4:
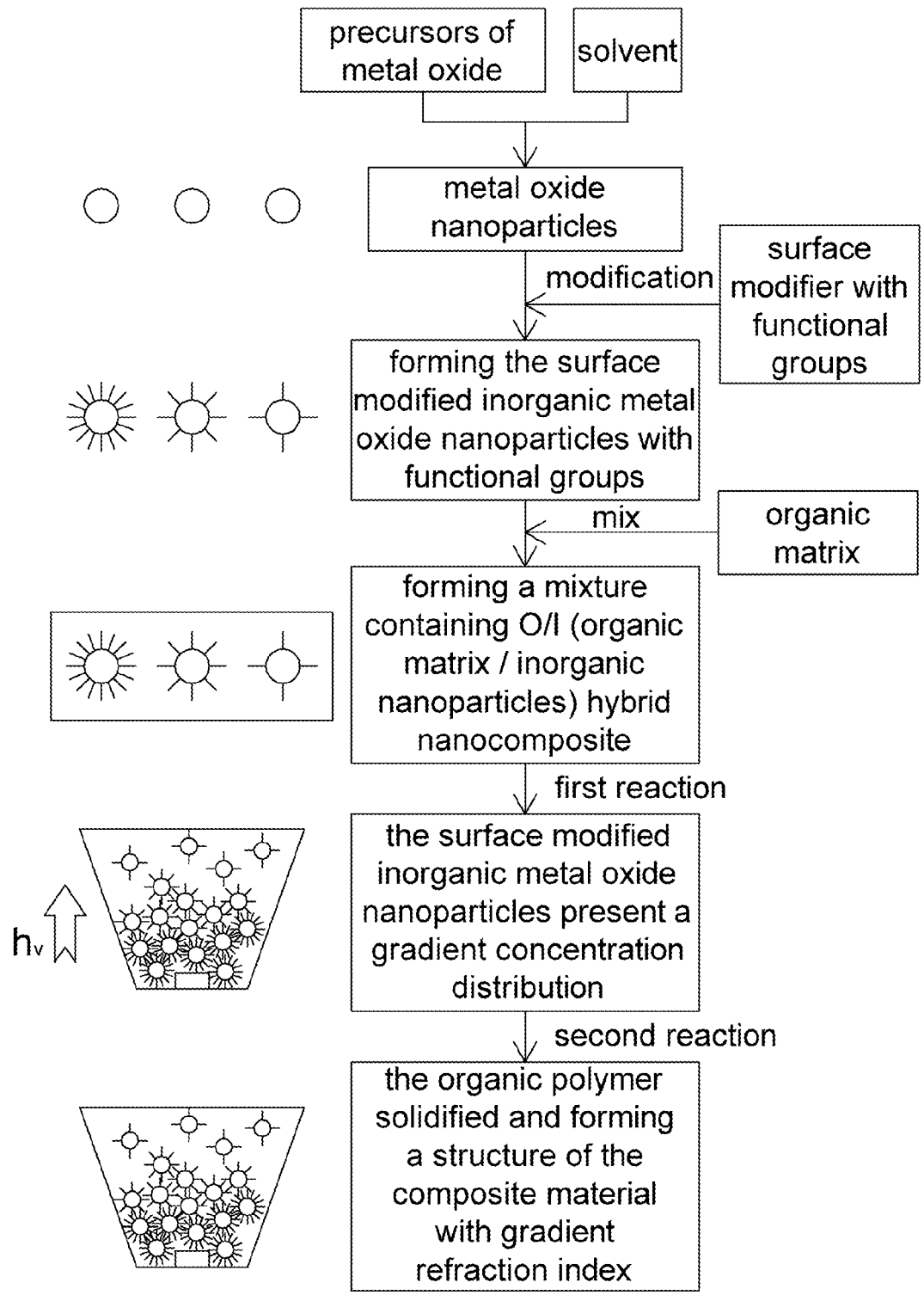
FIG. 4 depicts a method of manufacturing the composite material with gradient refraction index according to an embodiment of the disclosure.

FIG. 4 depicts a method of manufacturing the composite material with gradient refraction index according to an embodiment of the disclosure. First, plural metal oxide nanoparticles are provided, which could be prepared on the one hand or commercial available. In an example of self-preparation, the precursors of the metal oxide nanoparticles are mixed with a solvent and then synthesized to form the metal oxide nanoparticles. Applicable synthesis methods for preparing the metal oxide nanoparticles include a sol-gel method, hydro-thermo method, and a high-temperature calcinations. The precursors of the metal oxide nanoparticles could be represented as M(OR)x, and M is selected from the group consisting of titanium (Ti), zirconium (Zr), zinc (Zn), silicon (Si), cerium (Ce), cadmium (Cd), aluminum (Al), iron (Fe), tantalum (Ta), copper (Cu), indium (In), lanthanum (La), vanadium (V), molybdenum (Mo) and tungsten (W), while R is selected from the group consisting of methyl group (—$CH_3$), ethyl group (—$C_2H_5$), propyl group (—$C_3H_7$), butyl group (—$C_4H_9$), pentyl group (—$C_5H_{11}$) and hexyl group (—$C_6H_{13}$), and x is an integer selected from 1 to 6. Although the metal oxide nanoparticles are used in the embodiment, the semiconductor nanoparticles could be selected as the nanoparticles for manufacturing the composite structure with gradient refraction index.

Examples of the solvent include alcohols and water, or Tetrahydrofuran (THF) and other suitable chemical agent. Additionally, the metal oxide nanoparticles could be selected from titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminum oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum(III) oxide ($La_2O_3$), vanadium(V) oxide ($V_2O_5$), molybdenum(VI) oxide ($MoO_3$) and tungsten(VI) oxide ($WO_3$).

Next, a surface modifier with functional groups is prepared. The surface modifier may contain suitable solvent, such as alcohols and water. The functional groups of the surface modifier could be photochemically polymerizable organic functional groups, acrylic functional groups, vinyl groups, and epoxide groups.

Example of acrylic functional group (H2C=CH—C(=O)—O) includes 3-methacryloxypropyltrimethoxysilane, and presented as the following formula:

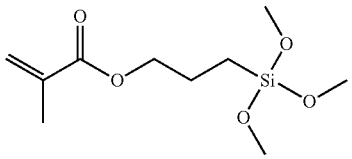 [SMILES: C=C(C)C(=O)OCCC[Si](OC)(OC)OC]

Example of acrylic functional group (H2C=CH—C(=O)—O) includes 2-Hydroxyethyl Methacrylate, and presented as the following formula:

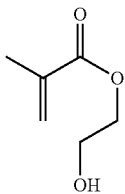

Example of epoxide groups (H2COCH—) includes 3-glycidoxypropyltrimethoxysilane, and presented as the following formula:

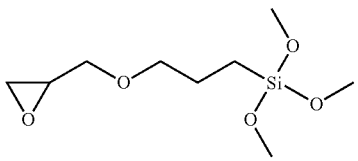

Examples of other functional groups (i.e. vinyl group, —C2H3-) include triethoxyvinylsilane, vinyl tris(2-methoxyethoxy)silane, vinyltrimethoxysilane, vinyltriacetoxysilane and allyltriethoxysilane. The chemical formulas are presented below.

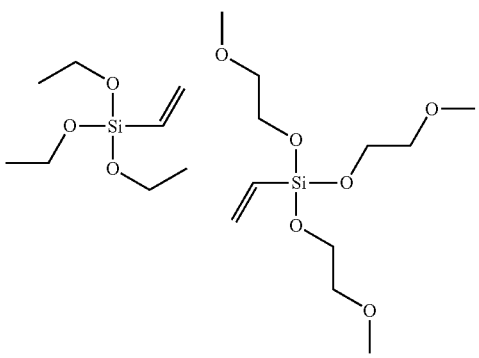

Triethoxyvinylsilane      Vinyl tris(2-methoxyethoxy) silane

-continued

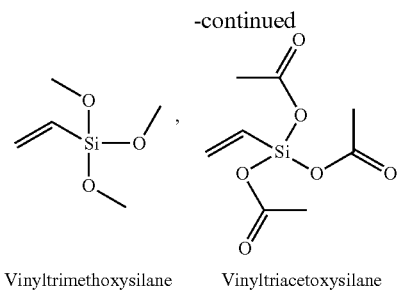

Vinyltrimethoxysilane      Vinyltriacetoxysilane

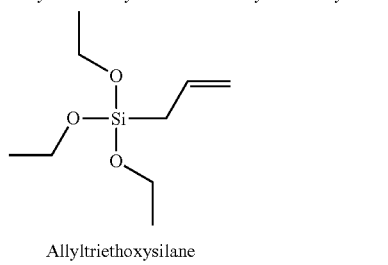

Allyltriethoxysilane

Next, the metal oxide nanoparticles and the surface modifier are mixed and then subjected by heating and refluxing to form the surface modified inorganic metal oxide nanoparticles with functional groups. In an embodiment, the functional groups of the surface modified inorganic metal oxide nanoparticles are photochemically polymerizable functional groups.

Afterwards, the surface modified inorganic metal oxide nanoparticles are transferred into an organic matrix to form a mixture containing O/I (organic/inorganic) hybrid nanocomposite. The organic matrix could be polymerizable organic monomers or polymers, polymerizable organic oligomers, or polymerizable silicone. Also, the organic matrix could be thermally polymerizable monomers and photochemically polymerizable monomers. When the disclosure is applied to the LED device, epoxy(polyepoxide), a thermosetting resin, for being used as the molding compound for encapsulating the LED is selected as the organic polymer of the embodiment.

It is noted that one batch of solution with certain concentration of nanoparticles could be prepared as the mixture containing O/I (organic/inorganic) hybrid nanocomposite, or several solutions with different concentrations of nanoparticles could be prepared as the mixture. The number distribution of the functional groups on the nanoparticles in each solution is different from that of the other solutions. Some solutions have larger number of the surface modified nanoparticles (i.e. higher concentration of the surface modified nanoparticles) with the functional groups, and some solutions have lower concentration of the surface modified nanoparticles with the functional groups. A mixture of the surface modified nanoparticles is formed by blending some amounts from different solutions, and then mixed with the organic matrix to form a mixture containing O/I (organic/inorganic) hybrid nanocomposite.

Next, a first reaction, i.e. a gradient distribution step, is performed on the mixture containing O/I (organic/inorganic) hybrid nanocomposite, so that the surface modified inorganic metal oxide nanoparticles present a gradient concentration distribution after the first reaction. The practical steps for performing the gradient distribution step depend on the properties of the functional groups on the surfaces of the inorganic metal oxide nanoparticles. If the inorganic metal oxide nanoparticles with photochemically polymerizable functional groups are adopted in the embodiment, a photo-initiator could be added in the mixture, and the mixture is irradiated with a light source (UV or visible light) to perform a photo polymerization step. The photo-initiator could be adequately selected according to the wavelength of the light source. Examples of the photo-initiator include diphenyl(2,4,6-trimethylbenzoyl) phosphine oxide (TPO), 2-Hydroxy-2-Methyl-1-phenyl-1-Porpanone or 1-hydroxy cyclohexyl phenyl ketone, Phosphine oxide, and phenyl bis(2,4,6-trimethyl benzoyl), and the wavelength of the light source is ranged from 300 nm-700 nm. During the photo polymerization, the light source attracts the surface modified inorganic metal oxide nanoparticles to move towards the light source. The more photo-polymerizable functional groups on the surfaces of the inorganic metal oxide nanoparticles, the faster the rate of polymerization. Accordingly, in the photo-polymerization, the nanoparticles or oligomers with faster rate of polymerization are quickly polymerized and moved toward the direction of the light source due to the light effect. Therefore, there is a gradient distribution related to the concentration of the functional groups of the nanoparticles or oligomers after photo-polymerization. As shown in FIG. 4, the light source is disposed in the bottom and irradiates upwards. Accordingly, the portion closer to the light source has higher concentration of the surface modified inorganic metal oxide nanoparticles with functional groups, while the portion further from the light source has lower concentration of the surface modified inorganic metal oxide nanoparticles with functional groups. Thus, a gradient distribution is created.

Next, a second reaction, i.e. a curing step, is performed on the mixture to solidify the organic matrix and form a structure of the composite material with gradient refraction index. The practical steps for performing the curing step depend on the properties of the organic matrix. If the organic matrix is a thermosetting monomer, the curing step is performed by heating. If the organic matrix is a photo-polymerizable monomer, the curing step is performed by light irradiation. Therefore, the technique for performing the curing step is determined according to the material of the organic matrix, and no particular limitation thereto. Also, the material of the organic matrix is selected according to the practical application.

After the first reaction (i.e. gradient step) and the second reaction (i.e. curing step), the structure with gradient composite material comprises a solid organic polymer (transferred from organic matrix) and the surface modified inorganic metal oxide nanoparticles with functional groups distributed in the solid organic polymer. The surface modified inorganic metal oxide nanoparticles with higher concentration of functional groups have the larger tendency of aggregation (faster rate of polymerization).

According to the embodiment illustrated above, the first reaction (i.e. gradient step) and the second reaction (i.e. curing step) could be respectively performed by photo-polymerization and thermo-polymerization, or all performed by photo-polymerization, depending on the material of the organic polymer in use. If the organic polymer is polymerized from the photo-polymerizable monomers, it is noted that the gradient step (to form a gradient distribution) and the curing step (to solidify the organic matrix) would be performed by the light irradiation with either different wavelengths or different power (at the same wavelength) to achieve the effects of gradient distribution and solidification. For example, a first light source having a first wavelength and a first power is used for performing the photo polymerization for the surface modified inorganic nanoparticles with photochemically polymerizable functional groups. A second light source having a second wavelength and a second power is used for curing the mixture containing photo-polymerizable organic matrix. The second wavelength could be different from the first wavelength; alternatively, the first and second wavelengths could be equal while the second power (ex: 1800 W) is larger than the first power (ex: 4 W).

Figure 1:
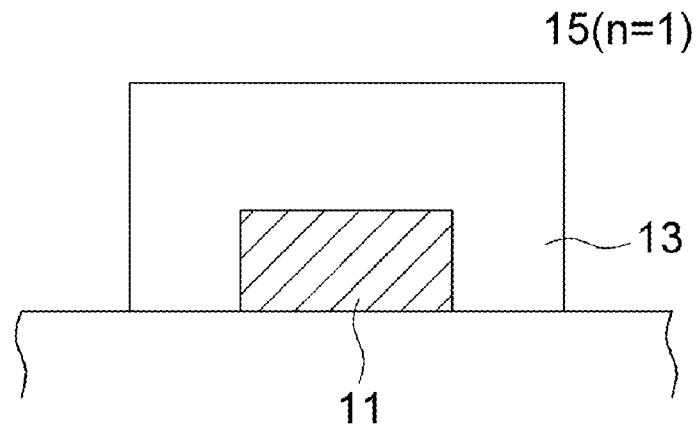
FIG. 1 simply depicts a conventional optical device with one layer of resin.
Figure 2:
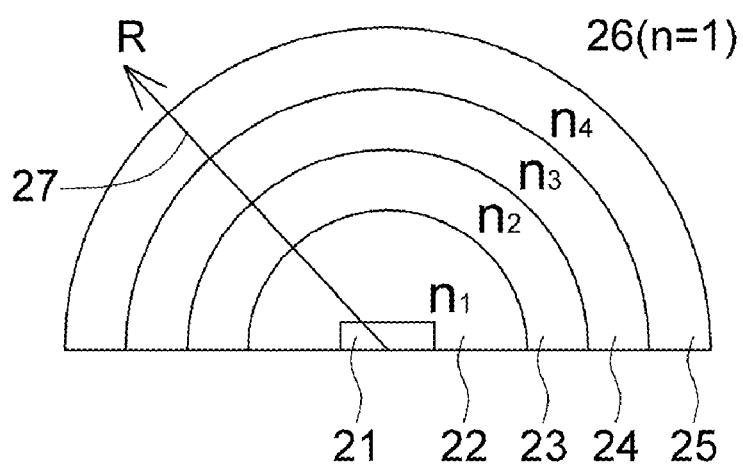
FIG. 2 simply depicts another conventional optical device, having three resin layers with different refraction index for encapsulating an LED.

Accordingly, the embodiment use simple manufacturing method to form a structure with gradient refraction index. There is no need to adopt several layers with different refraction index (as depicted in FIG. 2) by using complicated manufacturing method. Also, the light attenuation problem caused by the defects between the layer boundaries could be prevented.

Three embodiments and experiments are provided to demonstrate the disclosure related to the composite material with gradient refraction index and method of manufacturing the same. However, the compounds, materials and steps for providing illustrations in the embodiments or experiments are not intended to limit the invention. The modifications and variations can be made without departing from the spirit of the disclosure to meet the requirements of the practical applications.

<First Embodiment: Method of Manufacturing $ZrO_2$ Composite Material and Relative Experiments>

First Experiment

Figure 5:
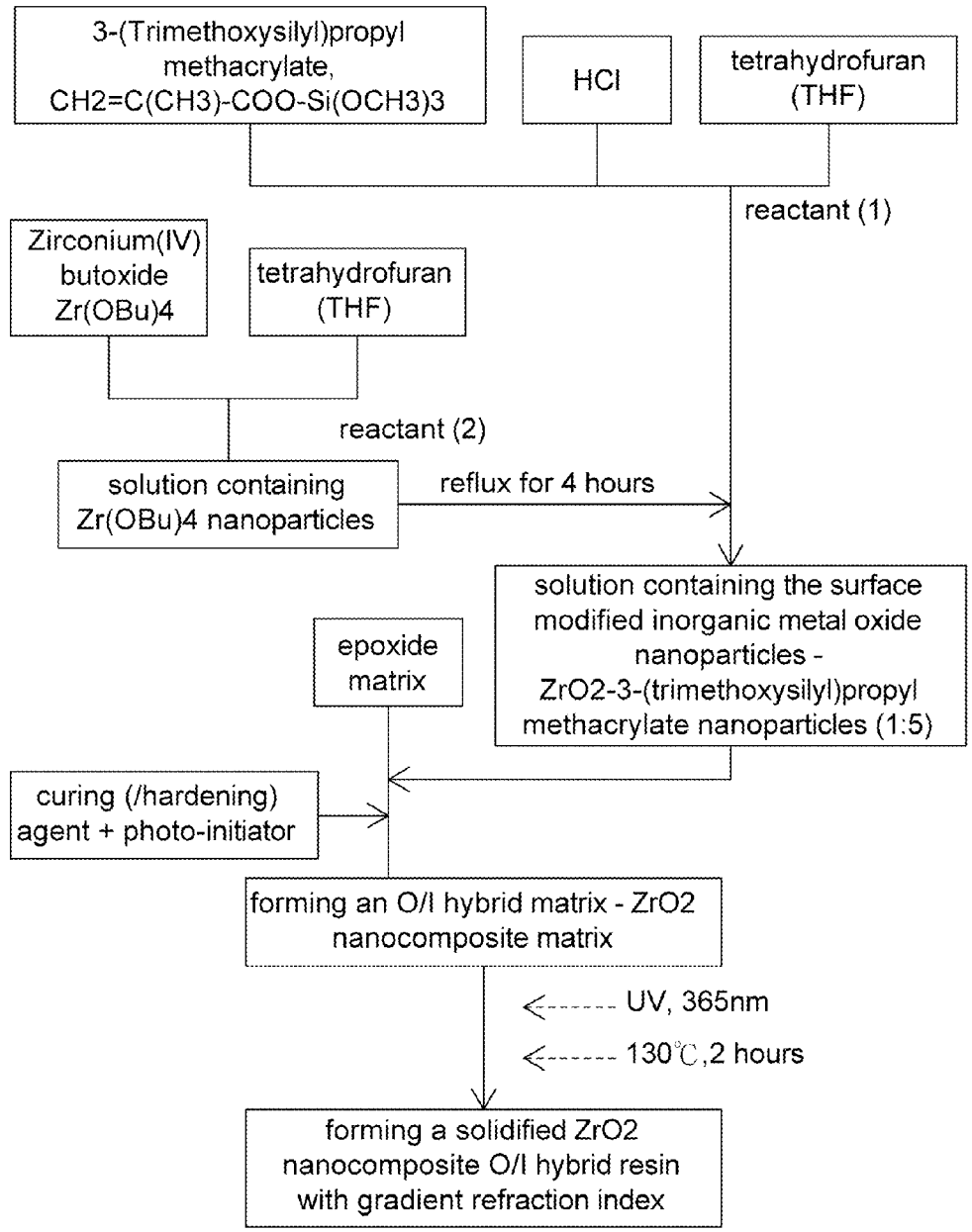
FIG. 5 is a process for manufacturing the composite material with gradient refraction index according to the first experiment of the first embodiment of the disclosure.

FIG. 5 is a process for manufacturing the composite material with gradient refraction index according to the first experiment of the first embodiment of the disclosure. Please refer to FIG. 5 and steps (A), (B) and (C) as described below. First, a solution containing surface modified inorganic metal oxide nanoparticles (i.e. $ZrO_2$) is formed, as described in the step (A). Then, the solution containing surface modified inorganic metal oxide nanoparticles is mixed with an organic matrix to form a mixture containing O/I (organic/inorganic nanoparticles) hybrid nanocomposite, as described in the step (B). Next, the mixture prepared in the step (B) is irradiated with the UV light and then heated to solidify, as described in the step (C).

Step (A)—$ZrO_2$: 3-(Trimethoxysilyl)propyl methacrylate=1:5

First, 3.5 g of HCl (0.1 N, Riedel-de Haën) is added into a three-neck round-bottomed flask containing 22.5 g of tetrahydrofuran (THF, Mallinckrodt chemicals), and stirred for about five minutes. Then, 50.287 g of 3-(trimethoxysilyl) propyl methacrylate (CH2=C(CH3)-COO—Si(OCH3)3, ALDRICH) is further added into the three-neck round-bottomed flask, and stirred for about 30 minutes at room temperature to form a reactant (1) as shown in FIG. 5.

15.53 g of zirconium(IV) butoxide (Zr(OBu)4, Fluka) is added into the conical flask containing 5.25 g of tetrahydrofuran (THF), and stirred for about 10 minutes to form a reactant (2) as shown in FIG. 5. The reactant (2) contains Zr(OBu)4 nanoparticles.

The reactant (2) is added into the reactant (1), and refluxed for 4 hours at the temperature of 65 to form a solution containing the surface modified inorganic metal oxide nanoparticles—$ZrO_2$-3-(trimethoxysilyl)propyl methacrylate nanoparticles (1:5), and the solid content is 79%.

Figure 6:
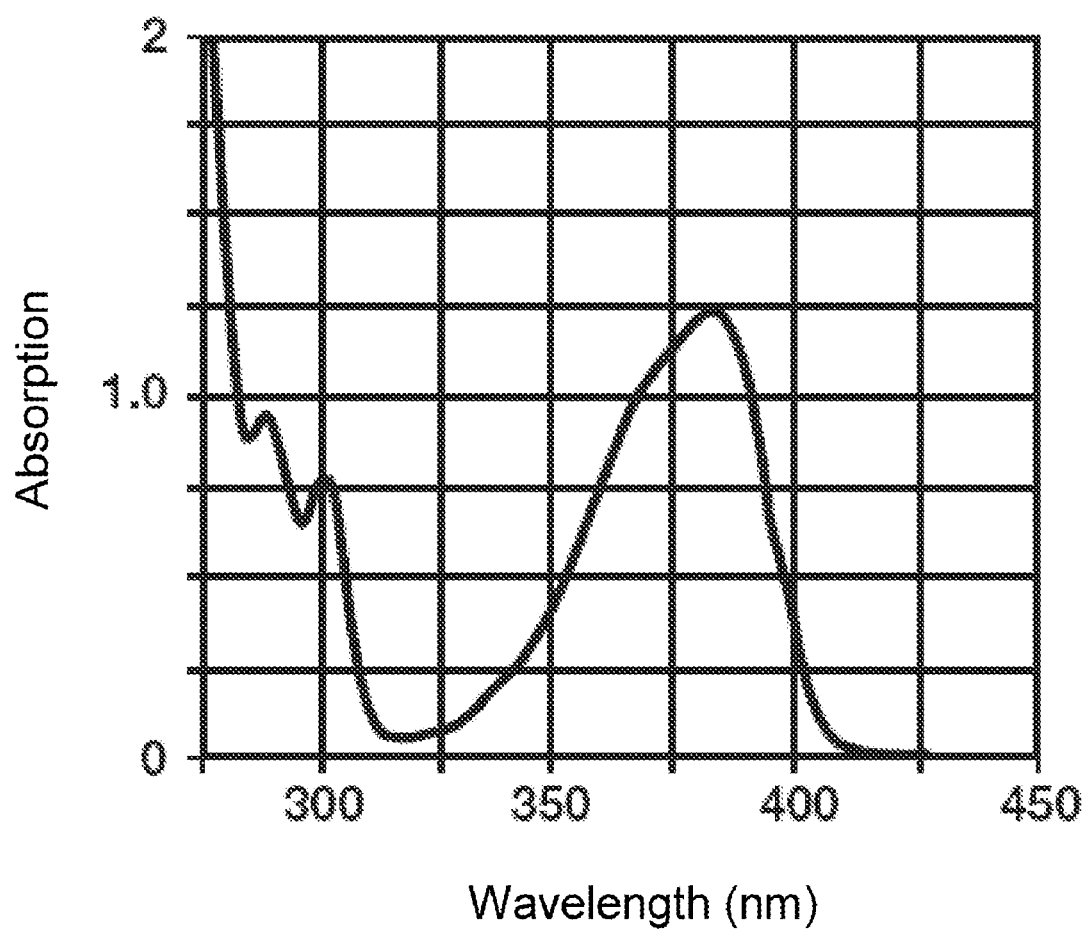
FIG. 6 is an ultraviolet spectrum (FIRSTCURE) of TPO.

Step (B)—Forming an O/I Hybrid Matrix—$ZrO_2$ Nanocomposite Matrix 1 g of the solution containing $ZrO_2$-3-(trimethoxysilyl) propyl methacrylate nanoparticles (1:5) is added into a sampling bottle containing 0.1 g of epoxy-3,4-epoxycyclohexanecarboxylate (ACROS) and stirred at room temperature. 0.1 g of the curing (/hardening) agent methyl hexahydrophthalic anhydride (MHHPA) and 0.03 g of photo-initiator diphenyl (2,4,6-trimethylbenzoyl)phosphine oxide (TPO, Double bond chemical IND. CO. LTD) are further added into the sampling bottle and stirred until well-mixed to form an O/I hybrid matrix—ZrO₂ nanocomposite matrix. The photo-initiator, TPO, is represented by the following formula. FIG. 6 is an ultraviolet spectrum (FIRSTCURE) of TPO.

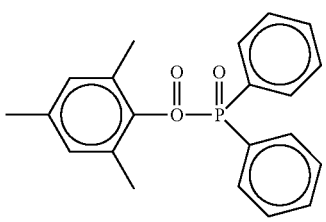

TPO

Step (C)—Forming an O/I Hybrid Resin: Solidified $ZrO_2$ Nanocomposite Resin with Gradient Refraction Index The O/I hybrid matrix—$ZrO_2$ nanocomposite matrix is injected into a molding tool (to form a block with a thickness of about 1 mm). The molding tool is then placed on the plate irradiated with the UV light of 365 nm wavelength. After five minutes, the lower portions of the matrix are gradually solidified. The wavelength of the UV light is determined based on the ultraviolet spectrum of TPO as shown in FIG. 6. It is known that the wavelength of the UV light is determined based on the ultraviolet spectrum of the photo-initiator used in the embodiment, and no particular limitation thereto.

Next, the matrix sample is re-placed in the oven for baking about two hours. After baking, the matrix is solidified and transferred into a resin sample, and the resin sample stays in the molding tool until the temperature is naturally dropped to the room temperature. Afterwards, the resin sample removed from the molding tool is an O/I hybrid resin—a solidified $ZrO_2$ nanocomposite resin with gradient refraction index.

Figure 7:
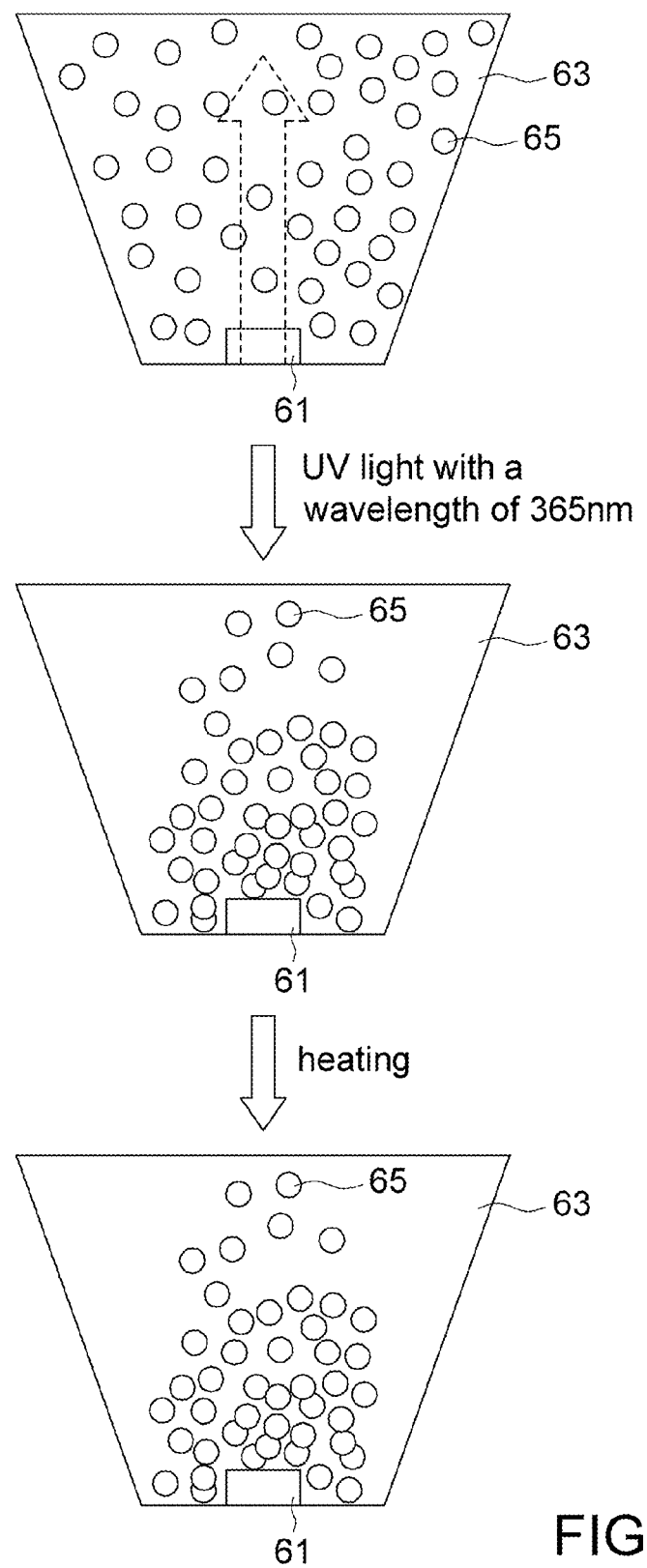
FIG. 7 is a simple illustration of manufacturing the composite material with gradient refraction index according to the first experiment of the first embodiment of the disclosure.

FIG. 7 is a simple illustration of manufacturing the composite material with gradient refraction index according to the first experiment of the first embodiment of the disclosure. The UV lighting component 61 is irradiated upwardly from the bottom of the molding tool. After irradiated by the UV lighting component 61, the O/I hybrid resin, contains epoxy 63 and the $ZrO_2$-3-(trimethoxysilyl)propyl methacrylate nanoparticles 65.

However, it is known by people in the art that the process and conditions described in the steps (A)~(C) are merely one of several experiments of the formation of O/I hybrid resin—$ZrO_2$ nanocomposite resin according to the disclosure. Those compounds, materials and numbers in the steps are for illustrations, not for limitation. The modifications and variations can be made without departing from the spirit of the disclosure to meet the requirements of the practical applications, so as to form an O/I hybrid resin—$ZrO_2$ nanocomposite resin.

<Determination of Elements and Contents in O/I Hybrid Resin of the First Experiment of the First Embodiment>

Structural Analysis is conducted for observing the O/I hybrid resin with gradient refraction index, containing epoxy and $ZrO_2$ nanocomposite, manufactured according to the first experiment of the first embodiment of the disclosure.

The O/I hybrid resin with gradient refraction index (containing epoxy and $ZrO_2$ nanocomposite) manufactured according to the steps (A)~(C) of the first experiment described above is observed by the Scanning Electron Microscope (SEM), and the elements and contents thereof in the O/I hybrid resin are also determined by the Energy Dispersive X-ray Spectrometer (EDX). Table 1 lists the results of the contents of the elements in the upper, middle and lower layers of the O/I hybrid resin manufactured according to the first experiment of the first embodiment of the disclosure.

TABLE 1

| | Upper layer | | | Middle layer | | | Lower layer | |
| --- | --- | --- | --- | --- | --- | --- | --- | --- |
| Element | Weight, % | Elemental Content, % | Element | Weight, % | Elemental Content, % | Element | Weight, % | Elemental Content, % |
| C | 51.00 | 61.51 | C | 49.40 | 61.45 | C | 45.26 | 57.78 |
| O | 37.31 | 34.06 | O | 34.06 | 31.81 | O | 36.20 | 34.70 |
| Si | 7.35 | 3.79 | Si | 10.95 | 5.82 | Si | 11.66 | 6.37 |
| Zr | 4.05 | 0.66 | Zr | 5.59 | 0.98 | Zr | 6.87 | 1.24 |

The SEM result has indicated that there are visible cross-sections in the O/I hybrid resin manufactured by using two-staged (ex. UV+heating) solidifying processes. The elemental analysis of the upper, middle and lower layers of the O/I hybrid resin are conducted by the Energy Dispersive X-ray Spectrometer (EDX), and the results have indicated that the contents of Zr in the upper, middle and lower layers of the O/I hybrid resin are 0.66%, 0.98% and 1.24%, respectively. In the O/I hybrid resin with gradient refraction index manufactured according to the first experiment of the first embodiment of the disclosure, the contents of Zr are gradually increased from the upper layer to the bottom layer (0.66<0.98<1.24) of the resin. Thus, those experimental results have proved that the resin containing $ZrO_2$ nanocomposite manufactured by the photo-polymerization (UV-light) followed by thermo-polymerization does possess the property of gradient refraction index.

Second Experiment

Figure 8:
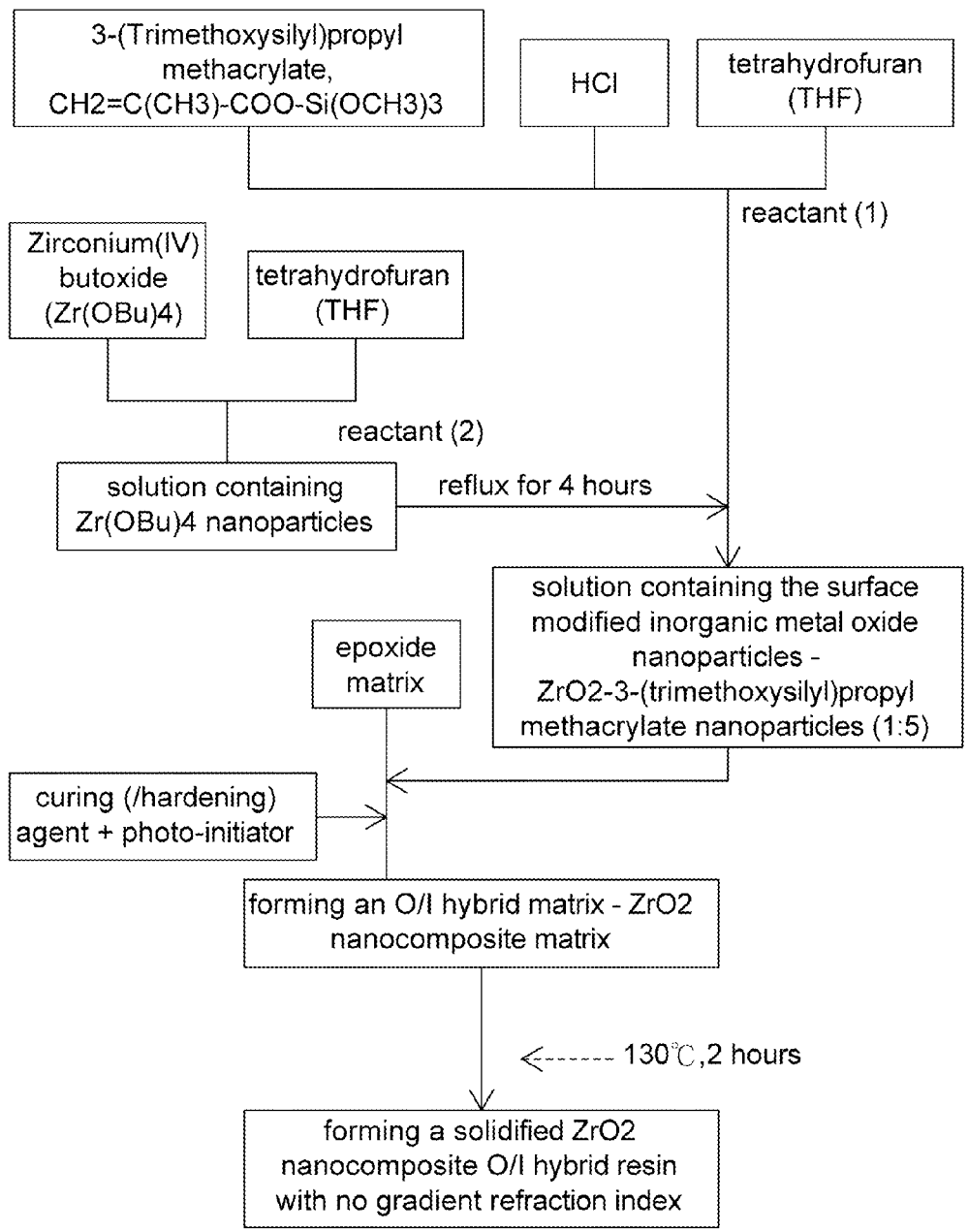
FIG. 8 is a process for manufacturing the O/I hybrid resin according to the second experiment of the first embodiment of the disclosure.

Please refer to FIG. 8 and manufacturing steps as described below. FIG. 8 is a process for manufacturing the O/I hybrid resin according to the second experiment of the first embodiment of the disclosure. The second experiment is a comparative experiment of the first experiment. The O/I hybrid resin manufactured according to the steps of the second experiment could not form the structure with gradient refraction index, as the resin manufactured according to the first experiment has.

Step (A)—$ZrO_2$: 3-(Trimethoxysilyl)propyl methacrylate=1:5

First, a solution containing surface modified inorganic metal oxide nanoparticles (i.e. $ZrO_2$) is formed, and the preparation is the same as the step (A) in the first experiment.

Step (B)—Forming an O/I Hybrid Matrix—$ZrO_2$ Nanocomposite Matrix

Then, the solution containing surface modified inorganic metal oxide nanoparticles is mixed with an organic matrix (i.e. epoxide matrix) to form a mixture containing O/I (organic/inorganic nanoparticles) hybrid nanocomposite. The preparation is the same as the step (B) in the first experiment.

Step (C)—Forming an O/I Hybrid Resin—a Solidified $ZrO_2$ Nanocomposite Resin with Homogeneous Distribution The O/I hybrid matrix—$ZrO_2$ nanocomposite matrix is injected into a molding tool (to form a block with a thickness of about 1 mm). The molding tool is then placed in the oven at 130 for about two hours. After baking, the matrix sample is solidified and transferred into a resin sample, and the resin sample stays in the molding tool until the temperature is naturally dropped to the room temperature. Afterwards, the resin sample removed from the molding tool is an O/I hybrid resin—a solidified $ZrO_2$ nanocomposite resin with homogeneous distribution.

Figure 9:
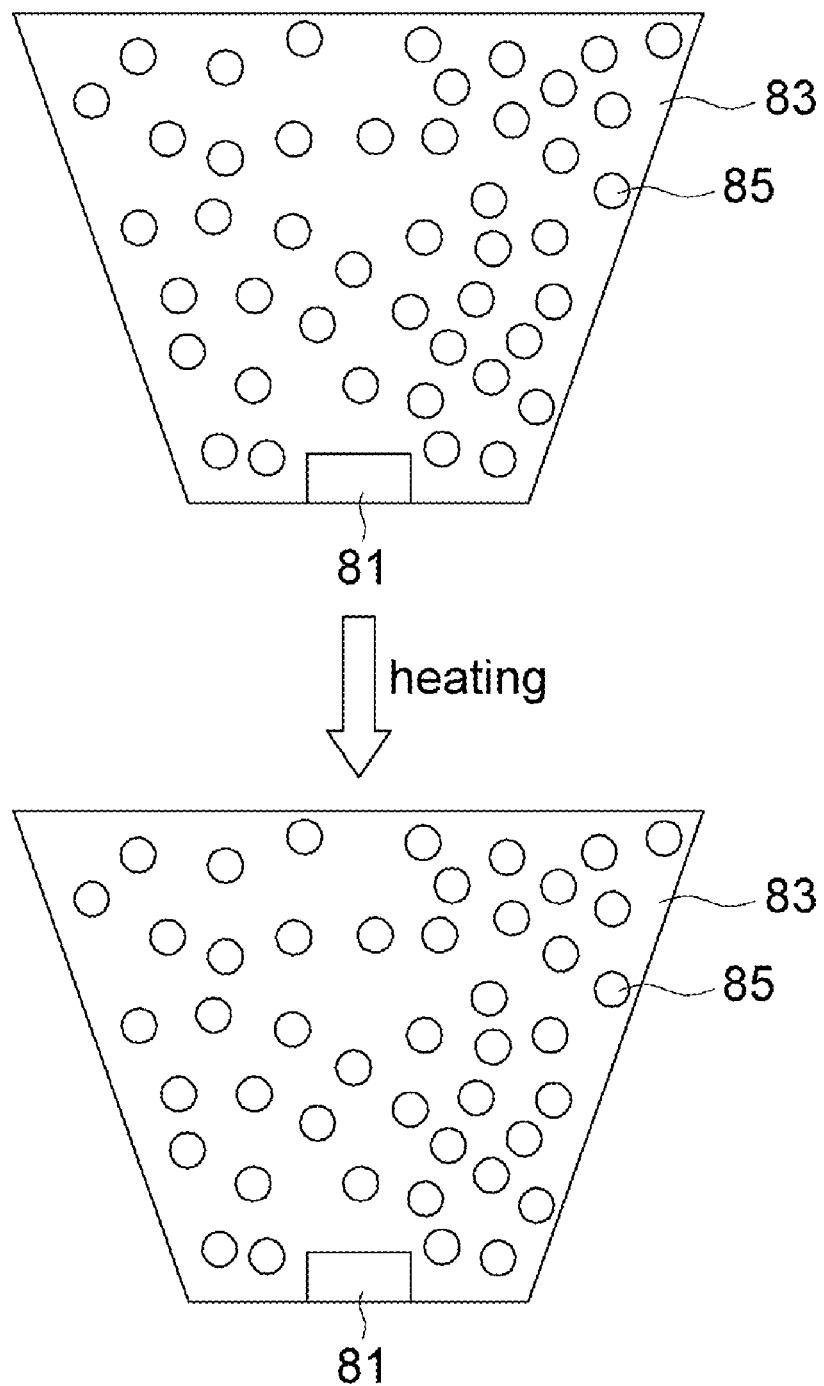
FIG. 9 is a simple illustration of manufacturing the O/I hybrid resin according to the second experiment of the first embodiment of the disclosure.

The difference of between the step (C) in the first and second experiments is no UV-irradiating step performed to the matrix in the second experiment. Instead, the matrix sample in the second experiment is heated directly for solidification. FIG. 9 is a simple illustration of manufacturing the O/I hybrid resin according to the second experiment of the first embodiment of the disclosure. The UV lighting component 81 is disposed at the bottom of the molding tool but not irradiating. Without UV-irradiation, the surface modified inorganic metal oxide nanoparticles (i.e. $ZrO_2$-3-(Trimethoxysilyl)propyl methacrylate) cannot moved towards the direction of the light since no photo-polymerization occurs. After heating, the nanoparticles 85 are still distributed in the epoxy 83 homogeneously, and no structure with gradient refraction index is formed.

<Determination of Elements and Contents in O/I Hybrid Resin of the Second Experiment>

Similarly, structural Analysis is conducted for observing the O/I hybrid resin manufactured according to the second experiment of the first embodiment of the disclosure.

The O/I hybrid resin manufactured according to the steps (A)~(C) of the second experiment is observed by the Scanning Electron Microscope (SEM), and the elements and contents thereof in the O/I hybrid resin are also determined by the Energy Dispersive X-ray Spectrometer (EDX). Table 2 lists the results of the contents of the elements in the upper, middle and lower layers of the O/I hybrid resin manufactured according to the second experiment of the first embodiment of the disclosure.

ment show no significant differences. The resin structure as shown in FIG. 9 presents a homogeneous distribution, not a gradient distribution.

Third Experiment

The related experiments conducted in the third experiment are for obtaining the refraction index of the upper, middle and lower layers of the O/I hybrid resin manufacture in the first experiment (please see Table 3, Table 4, FIG. 10 and related descriptions below), and also obtaining the ratios of $ZrO_2$ nanoparticles to epoxy of the upper, middle and lower layers of the O/I hybrid resin manufacture in the first experiment.

(A) Preparing the O/I Hybrid Films of $ZrO_2$ Nanocomposite Resin with Different Ratios (Including 50%, 70% and 90%)

1. Preparation of O/I Hybrid Film Containing 50% of $ZrO_2$ Nanoparticles 0.5 g of the solution containing $ZrO_2$-3-(trimethoxysilyl)propyl methacrylate nanoparticles (1:5) is added into a sampling bottle containing 0.2 g of epoxy-3,4-epoxycyclohexanecarboxylate and stirred at room temperature. 0.2 g of the curing (/hardening) agent methyl hexahydrophthalic anhydride (MHHPA) and 0.06 g of photo-initiator diphenyl(2,4,6-trimethylbenzoyl)phosphine oxide (TPO) are further added into the sampling bottle and stirred until well-mixed to form an O/I hybrid matrix—$ZrO_2$ nanocomposite matrix.

Drips of 0.5 g of the O/I hybrid matrix fall on a silicon wafer mounted on a spin coating machine. The silicon wafer mounted on the spin coating machine is rotated at 1000 rpm for 20 seconds, to form a thin film of the O/I hybrid matrix with $ZrO_2$ nanoparticles on the silicon wafer. The silicon wafer is placed into the UV exposure machine for photo-polymerization, and then placed into the oven at 130 for about two hours. After baking, the film stays on the wafer until the temperature is naturally dropped to the room temperature. Afterwards, the film removed from the wafer is a solidified O/I hybrid films containing 50% of $ZrO_2$ nanoparticles.

2. Preparation of O/I Hybrid Film Containing 70% of $ZrO_2$ Nanoparticles 0.886 g of the solution containing $ZrO_2$-3-(trimethoxysilyl)propyl methacrylate nanoparticles (1:5) is added into a sampling bottle containing 0.15 g of epoxy-3,4-epoxycyclohexanecarboxylate and stirred at room temperature. 0.15 g of the curing (/hardening) agent methyl hexahydrophthalic anhydride (MHHPA) and 0.045 g of photo-initiator diphenyl (2,4,6-trimethylbenzoyl)phosphine oxide (TPO) are further

TABLE 2

| | Upper layer | | | Middle layer | | | Lower layer | |
|---|---|---|---|---|---|---|---|---|
| Element | Weight, % | Elemental Content, % | Element | Weight, % | Elemental Content, % | Element | Weight, % | Elemental Content, % |
| C | 50.95 | 62.30 | C | 50.92 | 62.47 | C | 52.51 | 63.61 |
| O | 35.46 | 32.55 | O | 34.47 | 31.74 | O | 34.54 | 31.42 |
| Si | 8.20 | 4.29 | Si | 9.44 | 4.95 | Si | 8.12 | 4.21 |
| Zr | 5.39 | 0.87 | Zr | 5.18 | 0.84 | Zr | 4.83 | 0.77 |

The SEM result has indicated that the resin directly solidified by the thermal procedure presents a homogeneous structure. The elemental analysis of the upper, middle and lower layers of the O/I hybrid resin are conducted by the Energy Dispersive X-ray Spectrometer (EDX), and the results have indicated that the contents of Zr in the upper, middle and lower layers of the O/I hybrid resin are 0.87%, 0.84% and 0.77%, respectively. Therefore, the contents of Zr in the O/I hybrid resin manufactured according to the second experiadded into the sampling bottle and stirred until well-mixed to form an O/I hybrid matrix—$ZrO_2$ nanocomposite matrix.

Drips of 0.5 g of the O/I hybrid matrix fall on a silicon wafer mounted on a spin coating machine. The silicon wafer mounted on the spin coating machine is rotated at 1000 rpm for 20 seconds, to form a thin film of the O/I hybrid matrix with $ZrO_2$ nanoparticles on the silicon wafer. The silicon wafer is placed into the UV exposure machine for photo-polymerization, and then placed into the oven at 130 for about two hours. After baking, the film stays on the wafer until the temperature is naturally dropped to the room temperature. Afterwards, the film removed from the wafer is a solidified O/I hybrid films containing 70% of ZrO$_2$ nanoparticles.

3. Preparation of O/I Hybrid Film Containing 90% of ZrO$_2$ Nanoparticles 1.14 g of the solution containing ZrO$_2$-3-(trimethoxysilyl) propyl methacrylate nanoparticles (1:5) is added into a sampling bottle containing 0.05 g of epoxy-3,4-epoxycyclohexanecarboxylate and stirred at room temperature. 0.05 g of the curing (/hardening) agent methyl hexahydrophthalic anhydride (MHHPA) and 0.015 g of photo-initiator diphenyl(2,4,6-trimethylbenzoyl)phosphine oxide (TPO) are further added into the sampling bottle and stirred until well-mixed to form an O/I hybrid matrix—ZrO$_2$ nanocomposite matrix.

Drips of 0.5 g of the O/I hybrid matrix fall on a silicon wafer mounted on a spin coating machine. The silicon wafer mounted on the spin coating machine is rotated at 1000 rpm for 20 seconds, to form a thin film of the O/I hybrid matrix with ZrO$_2$ nanoparticles on the silicon wafer. The silicon wafer is placed into the UV exposure machine for photopolymerization, and then placed into the oven at 130 for about two hours. After baking, the film stays on the wafer until the temperature is naturally dropped to the room temperature. Afterwards, the film removed from the wafer is a solidified O/I hybrid films containing 90% of ZrO$_2$ nanoparticles.

(B) Measuring the O/I Hybrid Films of ZrO$_2$ Nanocomposite Resin with Different Ratios (Including 50%, 70% and 90%) Prepared as Described in (A) by Prism Coupler After measuring by the Prism Coupler, the O/I hybrid film 1 (containing 50% of ZrO$_2$ nanoparticles) has refraction index of 1.5054, the O/I hybrid film 2 (containing 70% of ZrO$_2$ nanoparticles) has refraction index of 1.5059, and the O/I hybrid film 3 (containing 90% of ZrO$_2$ nanoparticles) has refraction index of 1.5062.

Also, the contents of Zr in the O/I hybrid films are measured by the Energy Dispersive X-ray Spectrometer (EDX). The results indicated that the content of Zr in the O/I hybrid film 1 (containing 50% of ZrO$_2$ nanoparticles) is 0.86%, the content of Zr in the O/I hybrid film 2 (containing 70% of ZrO$_2$ nanoparticles) is 1.2%, and the content of Zr in the O/I hybrid film 3 (containing 90% of ZrO$_2$ nanoparticles) is 1.52%.

Table 3 shows the results of the refraction index, the contents of C and Zr in three O/I hybrid films with different ratios of ZrO$_2$ nanoparticles.

TABLE 3

| ZrO$_2$ nanoparticles/epoxy, % | Refraction index, RI | Zr atom, % | C atom, % |
| --- | --- | --- | --- |
| 50 | 1.5054 | 0.86 | 63.39 |
| 70 | 1.5059 | 1.2 | 56.24 |
| 90 | 1.5062 | 1.52 | 51.57 |

Figure 10:
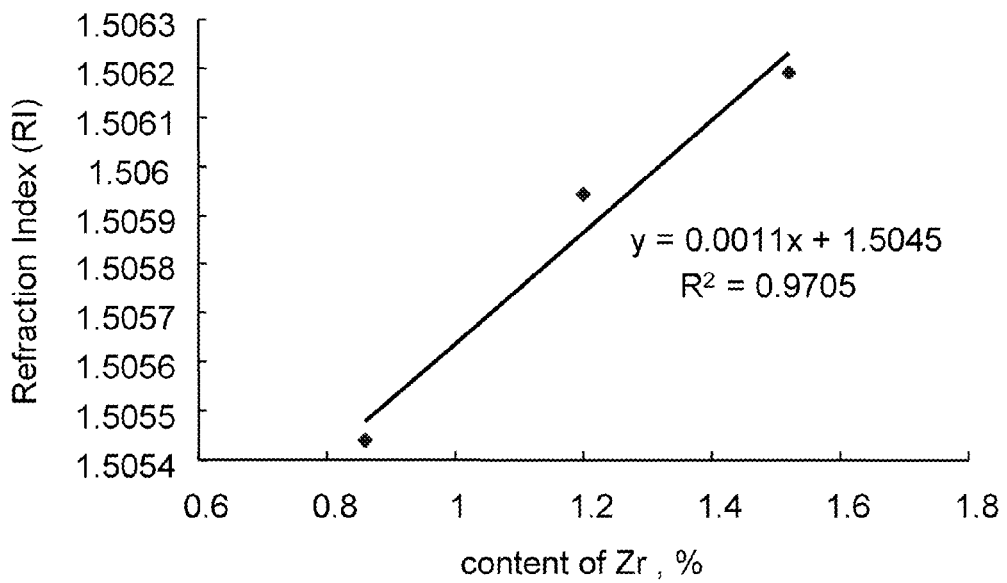
FIG. 10 shows a relationship between the refraction index and the content of Zr.

The refraction index relationship can be determined by plotting refraction index (Y-axis) versus content of Zr (X-axis) as depicted in FIG. 10. The relationship of refraction index is represented as the equation (1):

$$RI = 0.0011(Zr\%) + 1.5045 \quad (1)$$

In the first experiment of the first embodiment, the contents of Zr in the upper, middle and lower layers of the O/I hybrid resin are 0.66%, 0.98% and 1.24%, respectively. The refraction index of the upper, middle and lower layers of the O/I hybrid resin can be respectively determined by using the equation (1), and the results are listed in Table 4.

TABLE 4

| Zr atom, % | C atom, % | Refraction index, RI |
| --- | --- | --- |
| 0.66 | 63.93 | 1.5052 |
| 0.98 | 65.25 | 1.5056 |
| 1.24 | 61.7 | 1.5059 |

The results as listed in Table 4 have proved that the refraction index of 1.5052, 1.5056 and 1.5059 of the upper, middle and bottom layers of the O/I hybrid resin manufactured according to the first experiment of the first embodiment of the disclosure are gradually increased.

Figure 11:
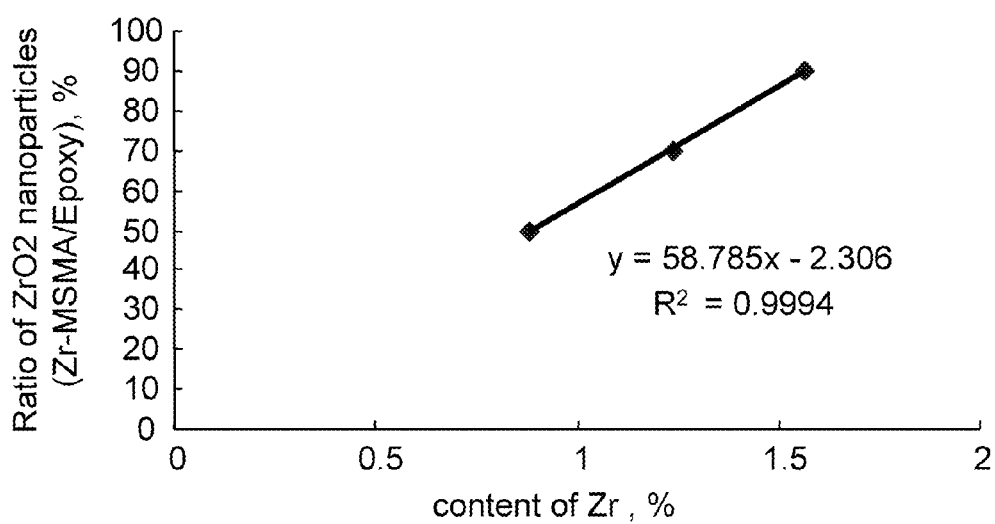
FIG. 11 shows a relationship between the ratio of $ZrO_2$ nanoparticles and the content of Zr.

Additionally, the relationship between the ratio of ZrO$_2$ nanoparticles and content of Zr can be determined by plotting the ratio of ZrO$_2$ nanoparticles (Y-axis, 50%, 70% and 90%) versus content of Zr (X-axis) as depicted in FIG. 11. The relationship is represented as the equation (2):

$$\text{the ratio of ZrO}_2 \text{ nanoparticles (\%)} = 58.785 \text{ (Zr \%)} - 2.306 \quad (2)$$

In the first experiment of the first embodiment, the contents of Zr in the upper, middle and lower layers of the O/I hybrid resin are 0.66%, 0.98% and 1.24%, respectively. The ratio of ZrO$_2$ nanoparticles of the upper, middle and lower layers of the O/I hybrid resin can be respectively determined by using the equation (2), and the results are listed in Table 5.

TABLE 5

| Zr atom, % | C atom, % | ZrO$_2$ nanoparticles/epoxy, % |
| --- | --- | --- |
| 0.66 | 63.93 | 36.4921 |
| 0.98 | 65.25 | 55.3033 |
| 1.24 | 61.7 | 70.5874 |

The results as listed in Table 5 have proved that the ratios of ZrO$_2$ nanoparticles of 36.4921%, 55.3033% and 70.5874% in the upper, middle and bottom layers of the O/I hybrid resin manufactured according to the first experiment of the first embodiment of the disclosure are gradually increased. Moreover, the ratio of ZrO$_2$ nanoparticles of any of the upper, middle and bottom layers (36.4921%, 55.3033% and 70.5874%) of the O/I hybrid resin manufactured according to the first experiment of the first embodiment of the disclosure is much higher than the ratio of the conventional hybrid resin (which no more than 20%).

>Second Embodiment: Method of Manufacturing TiO$_2$ Composite Material and Relative Experiments>

First Experiment

Figure 12:
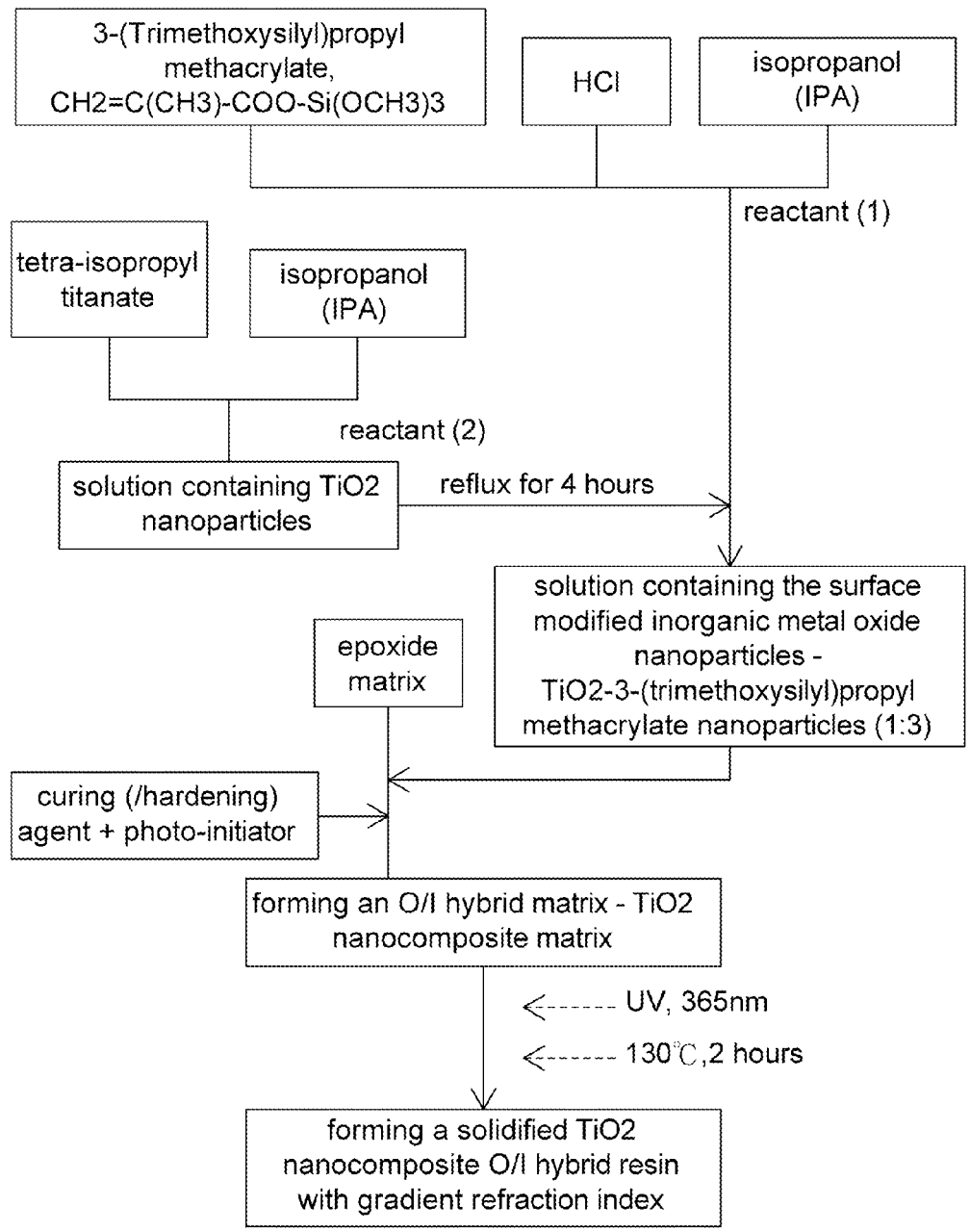
FIG. 12 is a process for manufacturing the composite material with gradient refraction index according to the first experiment of the second embodiment of the disclosure.

FIG. 12 is a process for manufacturing the composite material with gradient refraction index according to the first experiment of the second embodiment of the disclosure. Please refer to FIG. 12 and steps (A), (B) and (C) as described below. First, a solution containing surface modified inorganic TiO$_2$ nanoparticles is formed, as described in the step (A). Then, the solution containing surface modified inorganic TiO$_2$ nanoparticles is mixed with an organic matrix to form a mixture containing O/I (organic/inorganic nanoparticles) hybrid nanocomposite, as described in the step (B). Next, the mixture prepared in the step (B) is irradiated with the UV light and then heated to solidify, as described in the step (C).

Step (A)—TiO$_2$: 3-(Trimethoxysilyl)propyl methacrylate=1:3

First, 0.5 g of HCl (0.1N, Riedel-de Haën) is added into a three-neck round-bottomed flask containing 10 g of isopropanol (IPA, Mallinckrodt chemicals), and stirred for about five minutes. Then, 24.9 g of 3-(trimethoxysilyl)propyl methacrylate, ALDRICH) is further added into the three-neck round-bottomed flask, and stirred for about 30 minutes at room temperature to form a reactant (1) as shown in FIG. 12.

9.5 g of Tetra-isopropyl titanate (ALDRICH) is added into the conical flask containing 20 g of isopropanol (IPA), and stirred for about 10 minutes to form a reactant (2) as shown in FIG. 12. The reactant (2) contains $TiO_2$ nanoparticles.

The reactant (2) is added into the reactant (1), and refluxed for 4 hours at the temperature of 85 to form a solution containing the surface modified inorganic metal oxide nanoparticles—$TiO_2$-3-(trimethoxysilyl)propyl methacrylate nanoparticles (1:3), and the solid content is 33.97%.

Step (B)—Forming an O/I Hybrid Matrix—$TiO_2$ Nanocomposite Matrix 2.355 g of the solution containing $TiO_2$-3-(trimethoxysilyl)propyl methacrylate nanoparticles (1:3) is added into a sampling bottle containing 0.1 g of epoxy-3,4-epoxycyclohexanecarboxylate (ACROS) and stirred at room temperature. 0.1 g of the curing (/hardening) agent methyl hexahydrophthalic anhydride (MHHPA) and 0.03 g of photo-initiator diphenyl(2,4,6-trimethylbenzoyl)phosphine oxide (TPO, Double bond chemical IND. CO. LTD) are further added into the sampling bottle and stirred until well-mixed to form an O/I hybrid matrix—$TiO_2$ nanocomposite matrix. The photo-initiator, TPO, is represented in the first embodiment, and an ultraviolet spectrum of TPO is depicted in FIG. 6.

Step (C)—Forming an O/I hybrid Resin—a Solidified $TiO_2$ Nanocomposite Resin with Gradient Refraction Index The O/I hybrid matrix—$ZrO_2$ nanocomposite matrix is injected into a molding tool (to form a block with a thickness of about 1 mm). The molding tool is then placed on the plate irradiated with the UV light of 365 nm wavelength. After five minutes, the lower portions of the matrix are gradually solidified. The wavelength of the UV light is determined based on the ultraviolet spectrum of TPO (as shown in FIG. 6). It is known that the wavelength of the UV light is determined based on the ultraviolet spectrum of the photo-initiator used in the embodiment, and no particular limitation thereto.

Next, the matrix sample is re-placed in the oven of 130 for about two hours. After baking, the matrix sample is solidified and transferred into a resin sample, and the resin sample stays in the molding tool until the temperature is naturally dropped to the room temperature. Afterwards, the resin sample removed from the molding tool is an O/I hybrid resin—a solidified $TiO_2$ nanocomposite resin with gradient refraction index.

Similarly, it is known by people in the art that the process and conditions described in the steps (A)~(C) are merely one of several experiments of the formation of O/I hybrid resin—$TiO_2$ nanocomposite resin according to the disclosure. Those compounds, materials and numbers in the steps are for illustrations, not for limitation. The modifications and variations can be made without departing from the spirit of the disclosure to meet the requirements of the practical applications, so as to form an O/I hybrid resin—$TiO_2$ nanocomposite resin.

<Determination of Elements and Contents in O/I Hybrid Resin of the First Experiment of the Second Embodiment>

Structural Analysis is conducted for observing the O/I hybrid resin with gradient refraction index, containing epoxy and $TiO_2$ nanocomposite, manufactured according to the first experiment of the second embodiment of the disclosure.

The O/I hybrid resin with gradient refraction index (containing epoxy and $TiO_2$ nanocomposite) manufactured according to the steps (A)~(C) of the first experiment described above is observed by the Scanning Electron Microscope (SEM), and the elements and contents thereof in the O/I hybrid resin are also determined by the Energy Dispersive X-ray Spectrometer (EDX).

Table 6 lists the results of the contents of the elements in the upper, middle and lower layers of the O/I hybrid resin with $TiO_2$ nanocomposite manufactured according to the first experiment of the second embodiment of the disclosure.

TABLE 6

| | Upper layer | | | Middle layer | | | Lower layer | |
|---|---|---|---|---|---|---|---|---|
| Element | Weight, % | Elemental Content, % | Element | Weight, % | Elemental Content, % | Element | Weight, % | Elemental Content, % |
| C | 0.99 | 56.46 | C | 0.98 | 56.42 | C | 0.81 | 54.84 |
| O | 0.87 | 37.08 | O | 0.84 | 36.18 | O | 0.73 | 36.88 |
| Si | 0.21 | 5.09 | Si | 0.24 | 5.94 | Si | 0.23 | 6.72 |
| Ti | 0.1 | 1.37 | Ti | 0.10 | 1.46 | Ti | 0.09 | 1.56 |

The SEM result has indicated that there are visible cross-sections in the O/I hybrid resin manufactured by using two-staged (ex. UV+heating) solidifying processes. The elemental analysis of the upper, middle and lower layers of the O/I hybrid resin are conducted by the Energy Dispersive X-ray Spectrometer (EDX), and the results have indicated that the contents of Ti in the upper, middle and lower layers of the O/I hybrid resin are 1.37%, 1.46% and 1.56%, respectively. In the O/I hybrid resin with gradient refraction index manufactured according to the first experiment of the second embodiment of the disclosure, the contents of Ti are gradually increased from the upper layer to the bottom layer (1.37<1.46<1.56) of the resin. Thus, those experimental results have proved that the resin containing $TiO_2$ nanocomposite manufactured by the photo-polymerization (UV-light) followed by thermo-polymerization does possess the property of gradient refraction index.

Second Experiment

The second experiment, which is a comparative experiment of the first experiment of the second embodiment, is also conducted here for comparison. The steps (A) and (B) of the second experiment are identical to the steps (A) and (B) of the first experiment as described above. The difference of between the step (C) in the first and second experiments is no UV-irradiating step performed to the matrix in the second experiment. Instead, the matrix sample in the second experiment is heated directly.

In the step (C) of the second experiment, the O/I hybrid matrix—$ZrO_2$ nanocomposite matrix is injected into a molding tool (to form a block with a thickness of about 1 mm), and the molding tool is then placed in the oven at 130 for about two hours. After baking, the matrix sample is solidified and transferred into a resin sample, and the resin sample stays in the molding tool until the temperature is naturally dropped to the room temperature. Afterwards, the resin sample removed from the molding tool is an O/I hybrid resin—a solidified $TiO_2$ nanocomposite resin with homogeneous distribution.

Without UV-irradiation, the surface modified inorganic metal oxide nanoparticles (i.e. $TiO_2$-3-(Trimethoxysilyl)propyl methacrylate) cannot moved towards the direction of the light since no photo-polymerization occurs. After heating, the nanoparticles are still distributed in the epoxy homogeneously. Thus, the O/I hybrid resin manufactured according to the steps of the second experiment could not form the structure with gradient refraction index, as the resin manufactured according to the first experiment has.

<Third Embodiment: Simulating Experiments of Light Extraction Efficiency of LED>

Figure 13A:
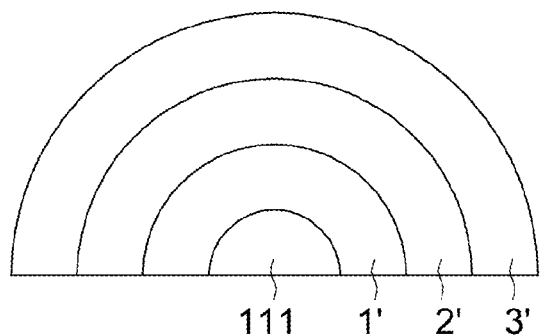
FIG. 13A ~FIG. 13C depict the simulating structures, respectively with typical resin encapsulation, high-RI resin encapsulation and gradient resin encapsulation, according to the third embodiment of the disclosure.
Figure 13B:
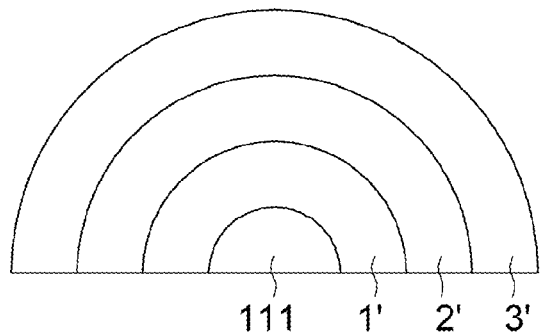
Figure 13C:
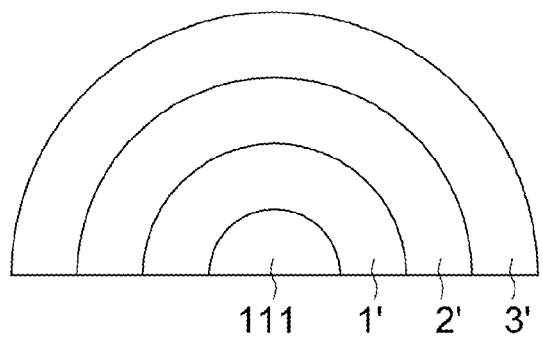

In the third embodiment, the experiments of light extraction efficiency of LED are conducted by simulating software—Advanced System Analysis Program (ASAP). In the simulation, the extraction efficiency of light emitted from the LED chip (RI=2.5) to the air (RI=1) is investigated, wherein the LED chip is encapsulated by the encapsulating resin. FIG. 13A ~FIG. 13C depict the simulating structures, respectively with typical resin encapsulation, high-RI resin encapsulation and gradient resin encapsulation, according to the third embodiment of the disclosure. During simulation, the factors of bottom reflection and secondary optics design are not included in the calculation. The simulating results are described below.

When the resin layers 1', 2', 3' all have refraction index of 1.5 as shown in FIG. 13A, the simulated light extraction efficiency of the LED 111 is 47.0023%. When the resin layers 1', 2', 3' all have higher refraction index of 1.55 as shown in FIG. 13B, the simulated light extraction efficiency of the LED 111 is 49.0658%. When the resin layers 1', 2', 3' respectively have gradient refraction index of 1.62, 1.55 and 1.5 as shown in FIG. 13C, the simulated light extraction efficiency of the LED 111 is 52.7596%.

According to the simulating results of the optical experiments in the third embodiment, it is proved that the light extraction efficiency of the optical device (ex: LED) encapsulated by the resin with gradient refraction index has been improved.

<Composite Material with Gradient Distribution and Different Properties at Opposite Surfaces, and Method of Manufacturing the Same>

In this embodiment, an organic-inorganic mixture is formed by transferring the surface modified inorganic nanoparticles into an organic matrix. Alternatively, an organic mixture is formed by mixing the oligomers with functional groups and the organic matrix. Then, the surface modified nanoparticles or oligomers with functional groups are induced to the surface of the composite material using photo-polymerization, wherein the polymerization rate of the monomer of the organic matrix is slower than the polymerization rate of the surface modified nanoparticles or oligomers with higher function group, so as to facilitate the diffusion of the surface modified nanoparticles or oligomers during the photocuring process. Finally, the whole composite material is cured by thermo-polymerization or photo-polymerization for solidification. The composite material manufactured according to this embodiment presents a gradient distribution of structure, and also presents different properties at opposite surfaces of the material, such as different properties of hardness, thermo-conductivity, electro-conductivity, hydrophilic and hydrophobic, and morphology at opposite surfaces.

In this embodiment, silicon dioxide ($SiO_2$) is selected as the material of metal oxide nanoparticles for proceeding the related experiments of gradient distribution. However, it is understood that other material could be used as the nanoparticles in the practical applications, and not limited to silicon dioxide.

Synthesis of Surface Modified $SiO_2$ Nanoparticles with Functional Groups

<Synthesis 1> Surface Modified $SiO_2$ Colloid Solution-1

20 g of methacryloxypropyltrimethoxy silane (MSMA) and 20 g of isopropyl alcohol are added into 100 g of $SiO_2$ colloid dispersion (20% of solid content, pH=9.44, Snowtex) in an ice bath, and the solution is stirred for about 40 minutes until a white gel occurs. Then, 80 g of isopropyl alcohol is added for diluting the solution as a transparent liquid. 600 g of isopropyl alcohol is then added into the transparent solution, and de-watered by a rotary evaporator at 45 to form a surface modified $SiO_2$ colloid solution-1. The surface modified $SiO_2$ colloid solution-1 prepared similarly by the steps of Synthesis 1 could contain 0.1%-50% of solid content of surface modified $SiO_2$ nanoparticles.

<Synthesis 2> Surface Modified $SiO_2$ Colloid Solution-2

Besides the method described in Synthesis 1, the method described in Synthesis 2 could be used for preparing the surface modified $SiO_2$ nanoparticles.

60 g of $SiO_2$ colloid dispersion (20% of solid content, 10 nm of average particle size and pH=2, BESIL-20A) is added into 100 g of isopropyl alcohol, and stirred for even dispersion. Then, 4.2 g of hexamethyldisiloxane (HDMSO) and 1.2 g of 3-glycidoxypropyl methyldiethoxysilane (DMS) are added into the solution, and the solution is reacted at 50 for proceeding surface modification. IPA is added into the solution after the reaction is completed. Then, 3,4-epoxy cyclohexyl methyl-3,4-epoxy cyclohexyl carboxylate (dissolved in IPA previously) is added into the solution, and de-watered by a rotary evaporator at 50 to form a surface modified $SiO_2$ colloid solution-2.

In the following Experiments 1~4, the mixtures contains the surface modified $SiO_2$ colloid solution-1 (with 50% of solid content) prepared by Synthesis 1 and methyl methacrylate (MMA, as the organic matrix of the embodiment). The details of each experiment are described below. Table 7 lists the results of the coefficient of thermal conductivity and hardness of the composite materials manufactured according to the Experiments 1~4.

MMA

EXPERIMENT 1

1% of thermo-polymerizing agent 2,2'-Azobisisobutyronitrile (AIBN) is added into 10 g of Methyl methacrylate (MMA), and stirred until well mix. The MMA solution is then ultrasonicated for 30 minutes. Next, the MMA solution is injected into a molding tool to form a block with a thickness of 2 mm. The molding tool is then placed into a water bath at 65 for 3 hours for pre-polymerization. Finally, the molding tool is placed in an oven of 100 for 6 hours, to obtain a homogeneous material of the Experiment 1 containing acrylate.

There are no additions of surface modified $SiO_2$ and photo-initiator in the Experiment 1. Also, no UV light irradiation is adopted in the Experiment 1.

After measurement, a coefficient of thermal conductivity of the material of Experiment 1 is 0.07 W/mK, and a pencil hardness of the material of Experiment 1 is 2H, approximately.

EXPERIMENT 2

1% of thermo-polymerizing agent 2,2'-Azobisisobutyronitrile (AIBN) is added into 0.6 g of surface modified $SiO_2$ colloid solution-1 (with 50% of solid content) and 9.7 g of Methyl methacrylate (MMA), and stirred until well mix. The solution (containing surface modified $SiO_2$ and MMA) is then ultrasonicated for 30 minutes. Next, the solution is injected into a molding tool to form a block with a thickness of 2 mm. The molding tool is then placed into a water bath at 65 for 3 hours for pre-polymerization. Finally, the molding tool is placed in an oven of 100 for 6 hours, to obtain a homogeneous composite material of Experiment 2 containing surface modified $SiO_2$ and acrylate.

There is no addition of photo-initiator in the Experiment 2. Also, no UV light irradiation is adopted in the Experiment 2.

After measurement, a coefficient of thermal conductivity of the material of Experiment 2 is 0.168 W/mK, and a pencil hardness of the material of Experiment 2 is 2H, approximately.

EXPERIMENT 3

1% of thermo-polymerizing agent 2,2'-Azobisisobutyronitrile (AIBN) and 1% of photo-initiator TPO (diphenyl(2,4,6-trimethylbenzoly)phosphine) are added into 0.6 g of surface modified $SiO_2$ colloid solution-1 (with 50% of solid content) and 9.7 g of Methyl methacrylate (MMA), and stirred until well mix. The solution (containing surface modified $SiO_2$ and MMA) is then ultrasonicated for 30 minutes. Next, the solution is injected into a molding tool to form a block with a thickness of 2 mm. The molding tool is then irradiated with the UV light (4 W) of 365 nm wavelength for 10 minutes. Next, the molding tool is placed into a water bath at 65 for 3 hours for pre-polymerization. Finally, the molding tool is placed in an oven of 100 for 6 hours, to obtain a gradient composite material of Experiment 3 containing surface modified $SiO_2$ and acrylate.

After measurement, the irradiated surface of the material in the Experiment 3 has a coefficient of thermal conductivity of 0.265 W/mK and a pencil hardness of 3H, approximately. The back surface of the material in the Experiment 3 has a coefficient of thermal conductivity of 0.149 W/mK and a pencil hardness of 2H, approximately.

Accordingly, performing the photo-polymerization (i.e. irradiated with 4 W UV light of 365 nm wavelength for 10 minutes) in the Experiment 3 makes the surface modified $SiO_2$ nanoparticles move towards the direction of the light. The more photo-polymerizable functional groups on the surfaces of the $SiO_2$ nanoparticles, the faster the rate of polymerization. Consequently, larger numbers of inorganic $SiO_2$ nanoparticles are disposed close to the irradiated surface of the material after photo-polymerization. Thus, the coefficient of thermal conductivity and pencil hardness of the irradiated surface of the material are all larger than that of the back surface of the material.

EXPERIMENT 4

1% of thermo-polymerizing agent 2,2'-Azobisisobutyronitrile (AIBN) is added into 2 g of surface modified $SiO_2$ colloid solution-1 (with 50% of solid content) and 9 g of Methyl methacrylate (MMA), and stirred until well mix. The solution (containing surface modified $SiO_2$ and MMA) is then ultrasonicated for 30 minutes. Next, the solution is injected into a molding tool to form a block with a thickness of 2 mm. The molding tool is then placed into a water bath at for 3 hours for pre-polymerization. Finally, the molding tool is placed in an oven of 100 for 6 hours, to obtain a homogeneous composite material of Experiment 4 containing surface modified $SiO_2$ and acrylate.

There is no addition of photo-initiator in the Experiment 4. Also, no UV light irradiation is adopted in the Experiment 4.

After measurement, a coefficient of thermal conductivity of the material of Experiment 4 is 0.29 W/mK, and a pencil hardness of the material of Experiment 4 is 2H, approximately.

TABLE 7

|  | MMA (wt %) | $SiO_2$ (wt %) | thermo-polymerizing agent, AIBN (wt %) | photo-initiator, TPO (wt %) | Irradiating time (using 4 W of UV light) | coefficient of thermal conductivity (irradiated surface/back surface) (W/mK) | pencil hardness |
|---|---|---|---|---|---|---|---|
| Experiment 1 | 100 | 0 | 1 | 0 | no | 0.07 | 2H |
| Experiment 2 | 97 | 3 | 1 | 0 | no | 0.17 | 2H |
| Experiment 3 | 97 | 3 | 1 | 1 | 10 mins | 0.27/0.15 | 3H/2H |
| Experiment 4 | 90 | 10 | 1 | 0 | no | 0.29 | 2H |

In the following Experiments 5~8, the mixtures contains the surface modified $SiO_2$ colloid solution-1 (with 50% of solid content) prepared by Synthesis 1 and pentaerythritol triacrylate (PET3A, as the organic matrix of the embodiment). In the following Experiments 9~10, the mixtures contains the urethane acrylate oligomers and pentaerythritol triacrylate (PET3A, as the organic matrix of the embodiment). The details of each experiment are described below. Table 8 lists the results of the hardness and transmittance of the composite materials manufactured according to the Experiments 5~10.

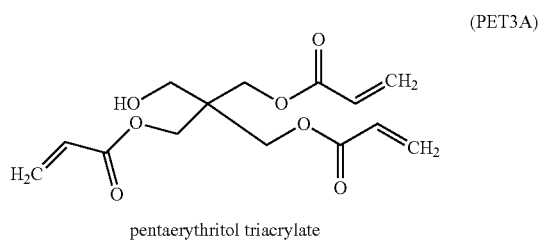 [SMILES: C=CC(=O)OCC(CO)(COC(=O)C=C)COC(=O)C=C]

(PET3A)

pentaerythritol triacrylate

EXPERIMENT 5

1% of thermo-polymerizing agent 2,2'-Azobisisobutyronitrile (AIBN) and 1% of photo-initiator TPO (diphenyl(2,4,6-trimethylbenzoly)phosphine) are added into 10 g of pentaerythritol triacrylate, and stirred until well mix. The solution is then ultrasonicated for 30 minutes. Next, the MMA solution is injected into a molding tool to form a block with a thickness of 2 mm. The molding tool is then irradiated with the UV light (4 W) of 365 nm wavelength for 10 minutes. The irradiated surface of the material has a tendency of solidification. The molding tool is then placed into a water bath at 65 for 3 hours for pre-polymerization. Finally, the molding tool is placed in an oven of 100 for 6 hours, to obtain a pure acrylate of the Experiment 5.

There is no addition of surface modified $SiO_2$ in the Experiment 5. Also, no UV light irradiation is adopted in the Experiment 5.

After measurement, the irradiated surface and the back surface of the material in the Experiment 5 have identical pencil hardness of 3H. The transmittance of the material in the Experiment 5 is 95.5%.

EXPERIMENT 6

1% of thermo-polymerizing agent 2,2'-Azobisisobutyronitrile (AIBN) is added into 1 g of surface modified $SiO_2$ colloid solution-1 (with 50% of solid content) and 9.5 g of pentaerythritol triacrylate, and stirred until well mix. The solution is then ultrasonicated for 30 minutes. Next, the solution is injected into a molding tool to form a block with a thickness of 2 mm. The molding tool is then placed into a water bath at 65 for 3 hours for pre-polymerization. Finally, the molding tool is placed in an oven of 100 for 6 hours, to obtain a homogeneous composite material of the Experiment 6 containing surface modified $SiO_2$ and acrylate.

There is no addition of photo-initiator in the Experiment 6. Also, no UV light irradiation is adopted in the Experiment 6.

After measurement, the irradiated surface and the back surface of the material in the Experiment 6 have identical pencil hardness of 5H. The transmittance of the material in the Experiment 6 is 91.55%.

EXPERIMENT 7

1% of thermo-polymerizing agent 2,2'-Azobisisobutyronitrile (AIBN) and 1% of photo-initiator TPO (diphenyl(2,4,6-trimethylbenzoly) phosphine) are added into 1 g of surface modified $SiO_2$ colloid solution-1 (with 50% of solid content) and 9.5 g of pentaerythritol triacrylate, and stirred until well mix. The solution is then ultrasonicated for 30 minutes. Next, the solution is injected into a molding tool to form a block with a thickness of 2 mm. The molding tool is then irradiated with the UV light (4 W) of 365 nm wavelength for 10 minutes. Next, the molding tool is placed into a water bath at 65 for 3 hours for pre-polymerization. Finally, the molding tool is placed in an oven of 100 for 6 hours, to obtain a gradient composite material of Experiment 7 containing surface modified $SiO_2$ and acrylate.

After measurement, the irradiated surface and the back surface of the material in the Experiment 7 have pencil hardness of about 6H and 5H, respectively. The transmittance of the material in the Experiment 7 is 91.72%.

EXPERIMENT 8

1% of thermo-polymerizing agent 2,2'-Azobisisobutyronitrile (AIBN) and 1% of photo-initiator TPO (diphenyl(2,4,6-trimethylbenzoly) phosphine) are added into 2 g of surface modified $SiO_2$ colloid solution-1 (with 50% of solid content) and 9 g of pentaerythritol triacrylate, and stirred until well mix. The solution is then ultrasonicated for 30 minutes. Next, the solution is injected into a molding tool to form a block with a thickness of 2 mm. The molding tool is then irradiated with the UV light (4 W) of 365 nm wavelength for 10 minutes. Next, the molding tool is placed into a water bath at 65 for 3 hours for pre-polymerization. Finally, the molding tool is placed in an oven of 100 for 6 hours, to obtain a gradient composite material of Experiment 8 containing surface modified $SiO_2$ and acrylate.

After measurement, the irradiated surface and the back surface of the material in the Experiment 8 have pencil hardness of about 9H and 7H, respectively. The transmittance of the material in the Experiment 8 is 91.75%.

EXPERIMENT 9

1% of thermo-polymerizing agent 2,2'-Azobisisobutyronitrile (AIBN) and 1% of photo-initiator TPO (diphenyl(2,4,6-trimethylbenzoly) phosphine) are added into 2 g of urethane acrylate oligomers and 8 g of pentaerythritol triacrylate, and stirred until well mix. The solution is then ultrasonicated for 30 minutes. Next, the solution is injected into a molding tool to form a block with a thickness of 2 mm. The molding tool is then irradiated with the UV light (4 W) of 365 nm wavelength for 10 minutes. Next, the molding tool is placed into a water bath at 65 for 3 hours for pre-polymerization. Finally, the molding tool is placed in an oven of 100 for 6 hours, to obtain a gradient composite material of Experiment 9 containing oligomers and acrylate.

After measurement, the irradiated surface and the back surface of the material in the Experiment 9 have pencil hardness of about 8H and 5H, respectively. The transmittance of the material in the Experiment 9 is 95.6%.

EXPERIMENT 10

1% of thermo-polymerizing agent 2,2'-Azobisisobutyronitrile (AIBN) and 1% of photo-initiator TPO (diphenyl(2,4,6-trimethylbenzoly) phosphine) are added into 2 g of urethane acrylate oligomers and 8 g of pentaerythritol triacrylate, and stirred until well mix. The solution is then ultrasonicated for 30 minutes. Next, the solution is injected into a molding tool to form a block with a thickness of 2 mm. The molding tool is placed into a water bath at 65 for 3 hours for pre-polymerization. Finally, the molding tool is placed in an oven of 100 for 6 hours, to obtain a homogeneous composite material of Experiment 10 containing oligomers and acrylate.

After measurement, the irradiated surface and the back surface of the material in the Experiment 10 have identical pencil hardness of about 5H. The transmittance of the material in the Experiment 10 is 95.5%.

Since no UV light irradiation is adopted in the Experiment 10, the composite material of the Experiment 10 shows no gradient distribution.

late (PET3A, EM235). Also, 1-hydroxy cyclohexyl phenyl ketone (chemcure-481) is added in each solution as a photo-initiator. Each solution is stirred until well mix, and spin-coated on a PC (polycarbonate) substrate to form a thin film with a thickness of 20 μm. Then, the thin film is irradiated with the UV light (4 W) of 254 nm wavelength for 2 minutes (photo-polymerization step). Next, the thin film is placed under the UV exposure machine for 10 seconds for solidification, wherein the UV light has a wavelength in the range of 250-450 nm and energy of 775 mj/cm$^2$. The results are listed in Table 9.

EXPERIMENTS 14~16

In the Experiments 14~16, different ratios of the surface modified SiO$_2$ colloid solution-1, which are 0 wt %, 10 wt %

TABLE 8

| | Pentaerythritol triacrylate (wt %) | SiO$_2$ (wt %) | thermo polymerizing agent, AIBN (wt %) | photo-initiator, TPO (wt %) | Irradiating time (using 4 W of UV light) | pencil hardness (irradiated surface/back surface) | Transmittance % (at 550 nm) |
|---|---|---|---|---|---|---|---|
| Experiment 5 | 100 | 0 | 1 | 1 | 10 mins | 3H/3H | 95.5 |
| Experiment 6 | 95 | 5 | 1 | 0 | no | 5H/5H | 91.55 |
| Experiment 7 | 95 | 5 | 1 | 1 | 10 mins | 6H/5H | 91.72 |
| Experiment 8 | 90 | 10 | 1 | 0 | 10 mins | 9H/7H | 91.75 |
| Experiment 9 | 80 | 20 oligomers | 1 | 1 | 10 mins | 8H/5H | 95.6 |
| Experiment 10 | 80 | 20 oligomers | 1 | 1 | no | 5H/5H | 95.5 |

According to the descriptions above, the materials of Experiments 1~10 are in the form of blocks (i.e. block with a thickness of 2 mm). By using the components and steps (ex: gradient step) as disclosed in the embodiment, the differences of hardness/coefficient of thermal conductivity between the irradiated surface and the back surface of the material occur. In the application of displaying device, the glass used for being the material of screen, which is expansive and hard to fabricate, could be replaced by the material manufactured by the embodiment of the disclosure, with its advantages of hard and cold texture at the touch surface of the screen and also good tenacity in a whole piece, due to the gradient distribution and different hardness of the opposite surfaces of the material.

In the following Experiments 11~16, the mixtures containing the surface modified SiO$_2$ colloid solution-1 (prepared by Synthesis 1) and acrylates (as the organic matrix of the embodiment) are fabricated in the form of thin films, for investigating whether the hardness of thin film is increased. The details of each experiment are described below. Table 9 lists the results of the hardness of the thin films with composite materials manufactured according to the Experiments 11~16.

EXPERIMENTS 11~13

In the Experiments 11~13, different ratios of the surface modified SiO$_2$ colloid solution-1, which are 0 wt %, 10 wt % and 20 wt %, are added into acrylate monomer mixture, respectively. The acrylate monomer mixture comprises dipentaerythritol hexaacrylate (DPHA), ethoxylated bisphenol-A diacrylate (BPA4EODA) and pentaerythritol triacryand 20 wt %, are added into acrylate monomer mixture, respectively. The acrylate monomer mixture comprises dipentaerythritol hexaacrylate (DPHA), ethoxylated bisphenol-A diacrylate (BPA4EODA) and pentaerythritol triacrylate (PET3A, EM235). Also, 1-hydroxy cyclohexyl phenyl ketone (chemcure-481) is added in each solution as a photo-initiator. Each solution is stirred until well mix, and spin-coated on a PC (polycarbonate) substrate to form a thin film with a thickness of 20 μm. Next, the thin film is placed under the UV exposure machine for 10 seconds for solidification, wherein the UV light has a wavelength in the range of 250-450 nm and energy of 775 mj/cm$^2$. No photo-polymerization step is conducted in each of the Experiments 14~16. The results are listed in Table 9.

Since a photo-polymerization step is conducted in each of the Experiments 11~13, Experiments 12 and 13 with addition of the surface modified SiO$_2$ all show the result of hardness increase. Thus, the embodiment of the disclosure is applicable to a thin film fabrication for increasing the hardness.

TABLE 9

| | acrylate monomer mixture (wt %) | SiO$_2$ (wt %) | photo-initiator (Chemcure-481) | Irradiating time (using 4 W of UV light) | pencil hardness |
|---|---|---|---|---|---|
| Experiment 11 | 100 | 0 | Yes | 2 mins | H |
| Experiment 12 | 90 | 10 | Yes | 2 mins | 2H |

TABLE 9-continued

| | acrylate monomer mixture (wt %) | SiO$_2$ (wt %) | photo-initiator (Chemcure-481) | Irradiating time (using 4 W of UV light) | pencil hardness |
|---|---|---|---|---|---|
| Experiment 13 | 80 | 20 | Yes | 2 mins | 2H |
| Experiment 14 | 100 | 0 | Yes | No | H |
| Experiment 15 | 90 | 10 | Yes | No | H |
| Experiment 16 | 80 | 20 | Yes | No | H |

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package, at least comprising:
   a light source; and
   a molding compound, encapsulating the light source, and the light source disposed in a bottom portion of the molding compound, the molding compound comprising:
   a solid organic polymer, polymerized from an organic matrix; and
   a plurality of surface modified inorganic nanoparticles with functional groups or oligomers with functional groups, distributed in the solid organic polymer, and the surface modified inorganic nanoparticles with functional groups or oligomers with functional groups being distributed from the bottom portion to a top portion of the molding compound so that the molding compound presents a gradient refraction index, wherein the surface modified inorganic nanoparticles with functional groups or oligomers with functional groups have higher polymerization rate than the organic matrix under a gradient-generating step.

2. The package according to claim 1, wherein the surface modified inorganic nanoparticles comprises plural nanoparticles with the same or different concentrations of the functional groups, and the surface modified inorganic nanoparticles with higher concentration of functional groups have the larger tendency of aggregation.

3. The package according to claim 1, wherein an aggregating portion having higher concentration of the surface modified inorganic nanoparticles with functional groups is closer to the light source and possesses higher refraction index, while an aggregating portion having lower concentration of the surface modified inorganic nanoparticles with functional groups is further from the light source and possesses lower refraction index.

4. The package according to claim 1, wherein the light source is a light emitting diode, and the surface modified inorganic nanoparticles are plural metal oxide nanoparticles with functional groups, or plural core-shell nanoparticles having metal oxide shell with functional groups or plural core solely.

5. The package according to claim 4, wherein metal oxides of the surface modified inorganic metal oxide nanoparticles or the core-shell nanoparticles with functional groups are selected from the group consisting of titanium dioxide (TiO$_2$), zirconium oxide (ZrO$_2$), silicon dioxide (SiO$_2$), zinc oxide (ZnO), cerium oxide (CeO$_2$), cadmium oxide (CdO), aluminium oxide (Al$_2$O$_3$), ferric oxide (Fe$_2$O$_3$), tantalum(V) oxide (Ta$_2$O$_5$), copper(I) oxide (Cu$_2$O), indium oxide (In$_2$O$_3$), lanthanum(III) oxide (La$_2$O$_3$), vanadium(V) oxide (V$_2$O$_5$), molybdenum(VI) oxide (MoO$_3$) and tungsten(VI) oxide (WO$_3$), and cores of the core-shell nanoparticles or cores solely are selected from the group consisting of CdSe, Cd$_x$Zn$_{1-x}$Se (0.01≦x≦0.99), Cd$_x$Zn$_{1-x}$S (0.01≦x≦0.99), Cd$_x$Zn$_{1-x}$S$_y$Se$_{1-y}$ (0.01≦x≦0.99 and 0.01≦y≦0.99), CdSe—ZnS, CdSe—CdTe, CdTe, CdS, CdS—ZnS, CdSe—CdTe—ZnSe, ZnS, ZnTe, PbS, PbSe, PbTe, ZnO, and Si.

6. The package according to claim 1, wherein the modified functional groups are selected from the group consisting of photochemically polymerizable organic functional groups, acrylic functional groups, and epoxide groups.

7. The package according to claim 1, wherein the modified functional groups of the nanoparticles are selected from the group consisting of 3-methacryloxypropyltrimethoxysilane, 3-glycidoxypropyltrimethoxysilane triethoxyvinylsilane, vinyl tris(2-methoxyethoxy)silane, vinyltrimethoxysilane, vinyltriacetoxysilane, and allyltriethoxysilane.

8. The package according to claim 1, wherein the functional groups of the oligomers are acrylate functional groups.

9. The package according to claim 1, wherein the solid organic polymer is selected from thermally polymerizable monomers and photochemically polymerizable monomers, comprising polymerizable organic monomers, acrylic monomers, organic oligomers, monomers with epoxide groups, and silicone.

10. A substrate with composite material, at least comprising:
    a first surface and a second surface disposed opposite;
    an acrylic polymer or an polyepoxide, polymerized from an acrylic matrix or an epoxy matrix, the acrylic polymer or the polyepoxide comprising:
    a concentrating sub-area, relatively close to the first surface; and
    a diffusing sub-area, relatively close to the second surface; and
    a plurality of surface modified inorganic nanoparticles with functional groups or oligomers with functional groups distributed in the acrylic polymer or the polyepoxide and further presenting a gradient distribution, and the surface modified inorganic nanoparticles comprising at least one kind of metal oxide nanoparticles, metal nanoparticles and semiconductor nanoparticles, more surface modified inorganic nanoparticles or oligomers distributed in the concentrating sub-area than in the diffusing sub-area, wherein the surface modified inorganic nanoparticles with functional groups or oligomers with functional groups have higher polymerization rate than the acrylic matrix under a gradient-generating step;
    wherein the surface modified inorganic nanoparticles comprises plural nanoparticles with the same or different concentrations of the functional groups, and the surface modified inorganic nanoparticles or oligomers with higher concentration of functional groups haying the larger tendency of aggregation and being closer to the concentrating sub-area, while the surface modified inorganic nanoparticles or oliqomers with lower concentration of functional groups being closer to the diffusing sub-area,
    wherein an aggregation tendency of the surface modified inorganic nanoparticles with functional groups or oliqomers with functional groups distributed in the acrylic polymer or the polyepoxide presents the gradient distribution, from higher aggregation tendency at the first surface to lower aggregation tendency at the second surface.

11. The substrate according to claim 10, presenting the gradient distribution from the first surface to the second surface, wherein the concentrating sub-area aggregated with higher concentration of the surface modified inorganic nanoparticles or oligomers with functional groups has higher hardness, while the diffusing sub-area distributed with lower concentration of the surface modified inorganic nanoparticles or oligomers with functional groups has lower hardness.

12. The substrate according to claim 10, wherein a first hardness of the first surface is higher than a second hardness of the second surface.

13. The substrate according to claim 10, wherein when the inorganic nanoparticles are plural metal oxide nanoparticles, the inorganic metal oxide nanoparticles are $M_XO_Y$, M is Si, Ti, Zr or Al, and X is 1, 2, or 3, and Y is 2, 3, 4 or 5.

14. The substrate according to claim 10, wherein when the inorganic nanoparticles are plural metal oxide nanoparticles, the inorganic metal oxide nanoparticles are selected from the group consisting of titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminium oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum (III) oxide ($La_2O_3$), vanadium(V) oxide ($V_2O_5$), molybdenum(VI) oxide ($MoO_3$) and tungsten(VI) oxide ($WO_3$);
when the inorganic nanoparticles are plural inorganic metal nanoparticles, the inorganic metal nanoparticles are selected from the group consisting of Cu, Ag, Au, Ni, Fe, Co; and
when the inorganic nanoparticles are plural inorganic semiconductor nanoparticles, the inorganic semiconductor nanoparticles comprising either plural core-shell nanoparticles having metal oxide shell or plural core solely, and the cores selected from the group consisting of CdSe, $Cd_xZn_{1-x}Se$ ($0.01 \leq x \leq 0.99$), $Cd_xZn_{1-x}S$ ($0.01 \leq x \leq 0.99$), $Cd_xZn_{1-x}S_ySe_{1-y}$ ($0.01 \leq x \leq 0.99$ and $0.01 \leq y \leq 0.99$), CdSe—ZnS, CdSe—CdTe, CdTe, CdS, CdS—ZnS, CdSe—CdTe—ZnSe, ZnS, ZnTe, PbS, PbSe, PbTe, ZnO, and Si.

15. The substrate according to claim 10, wherein the modified functional groups are selected from the group consisting of photochemically polymerizable organic functional groups, acrylic functional groups, and epoxide groups.

16. The substrate according to claim 10, wherein the modified functional groups of the nanoparticles are selected from the group consisting of 3-methacryloxypropyltrimethoxysilane, 3-glycidoxypropyltrimethoxysilane triethoxyvinylsilane, vinyl tris(2-methoxyethoxy)silane, vinyltrimethoxysilane, vinyltriacetoxysilane, and allyltriethoxysilane.

17. The substrate according to claim 10, wherein the functional groups of the oligomers are acrylate functional groups.

18. The substrate according to claim 10, wherein the acrylic polymer is polymerized from a series of acrylic monomers, comprising at least one of monomers with six functional groups, with five functional groups, with four functional groups, with three functional groups, with two functional groups, and with one functional group, or a combination thereof.

19. A structure with gradient composite material, comprising:
a solid organic polymer, polymerized from an organic matrix; and
a plurality of surface modified inorganic nanoparticles with functional groups or oligomers with functional groups, distributed in the solid organic polymer, the surface modified inorganic nanoparticles comprising at least one kind of metal oxide nanoparticles, metal nanoparticles and semiconductor nanoparticles, the surface modified inorganic nanoparticles with functional groups or oligomers with functional groups presenting a gradient distribution in the solid organic polymer;
wherein the surface modified inorganic nanoparticles with functional groups or oligomers with functional groups have higher polymerization rate than the organic matrix under a gradient-generating step, and the surface modified inorganic nanoparticles comprises plural nanoparticles with the same or different concentrations of the functional groups, and the surface modified inorganic nanoparticles with higher concentration of functional groups have the larger tendency of aggregation.

20. The structure according to claim 19, having at least one of properties of gradient refraction index, gradient hardness, gradient electrical conductivity and gradient thermal conductivity.

21. The structure according to claim 19, having a gradient refraction index, and a portion comprising higher concentration of the surface modified inorganic nanoparticles with functional groups has higher refraction index, and other portion comprising lower concentration of the surface modified inorganic nanoparticles with functional groups has lower refraction index.

22. The structure according to claim 19, having the gradient distribution, and a portion comprising higher concentration of the surface modified inorganic nanoparticles with functional groups or higher concentration of oligomers with functional groups has higher hardness.

23. The structure according to claim 19, wherein the surface modified inorganic nanoparticles with functional groups distributed in the solid organic polymer at least comprises a first concentration, a second concentration and a third concentration of the surface modified inorganic nanoparticles with functional groups, and the first concentration of the nanoparticles is larger than the second concentration of the nanoparticles, the second concentration of the nanoparticles is larger than the third concentration of the nanoparticles,
wherein the first concentration of the surface modified inorganic nanoparticles with functional groups have the larger tendency of aggregation than the second concentration of the surface modified inorganic nanoparticles with functional groups, and the second concentration of the surface modified inorganic nanoparticles with functional groups have the larger tendency of aggregation than the third concentration of the surface modified inorganic nanoparticles with functional groups.

24. The structure according to claim 23, wherein plural portions comprising the first, second and third concentrations of the surface modified inorganic nanoparticles with functional groups respectively generate a first refraction index, a second refraction index and a third refraction index, and the first refraction index is larger than the second refraction index, and the second refraction index is larger than the third refraction index.

25. The structure according to claim 23, wherein plural portions comprising the first, second and third concentrations of the surface modified inorganic nanoparticles with functional groups respectively generate a first hardness, a second hardness and a third hardness, and the first hardness is larger than the second hardness, and the second hardness is larger than the third hardness.

26. The structure according to claim 13, wherein the surface modified inorganic nanoparticles with functional groups are metal oxide nanoparticles, selected from the group consisting of titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminium oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum(III) oxide ($La_2O_3$), vanadium(V) oxide ($V_2O_5$), molybdenum(VI) oxide ($MoO_3$) and tungsten(VI) oxide ($WO_3$).

27. The structure according to claim 19, wherein the modified functional groups are one of photochemically or thermal polymerizable organic functional groups, acrylic functional groups, vinyl groups, and epoxide groups.

28. The structure according to claim 19, wherein the modified functional groups of the nanoparticles are selected from the group consisting of 3-methacryloxypropyltrimethoxysilane, 3-glycidoxypropyltrimethoxysilane triethoxyvinylsilane, vinyl tris(2-methoxyethoxy)silane, vinyltrimethoxysilane, vinyltriacetoxysilane, and allyltriethoxysilane.

29. The structure according to claim 19, wherein the functional groups of the oligomers are acrylate functional groups.

30. The structure according to claim 19, wherein the solid organic polymer is formed by polymerizing the organic matrix from a series of acrylic monomers, comprising at least one of monomers with six functional groups, with five functional groups, with four functional groups, with three functional groups, with two functional groups, and with one functional group or a combination thereof.

31. The structure according to claim 19, wherein the solid organic polymer is selected from thermally polymerizable monomers and photochemically polymerizable monomers, comprising polymerizable organic monomers, acrylic monomers, organic oligomers, monomers with epoxide groups, and silicone.

32. A method of manufacturing gradient composite material, comprising:
providing plural surface modified inorganic nanoparticles with functional groups or oligomers with functional groups, and the surface modified inorganic nanoparticles comprising at least one kind of metal oxide nanoparticles, metal nanoparticles and semiconductor nanoparticles; wherein the step of providing the surface modified inorganic nanoparticles with functional groups comprises:
providing a plurality of inorganic nanoparticles;
preparing a surface modifier with functional groups; and
mixing the inorganic nanoparticles and the surface modifier, and then subjected by heating and refluxing to form the surface modified inorganic nanoparticles with functional groups;
transferring the surface modified inorganic nanoparticles with functional groups or oligomers with functional groups into an organic matrix to form a mixture;
performing a gradient step, comprising a photo-polymerization step or a thermo-polymerization step for polymerizing and generating a gradient distribution of the surface modified inorganic nanoparticles with functional groups or oligomers with functional groups in the mixture; and
curing the mixture to solidify the organic matrix and form a structure with gradient composite, wherein the organic matrix is transferred into an organic polymer after curing.

33. The method according to claim 32, wherein the metal oxide nanoparticles are selected from the group consisting of titanium dioxide ($TiO_2$), zirconium oxide ($ZrO_2$), silicon dioxide ($SiO_2$), zinc oxide (ZnO), cerium oxide ($CeO_2$), cadmium oxide (CdO), aluminum oxide ($Al_2O_3$), ferric oxide ($Fe_2O_3$), tantalum(V) oxide ($Ta_2O_5$), copper(I) oxide ($Cu_2O$), indium oxide ($In_2O_3$), lanthanum(III) oxide ($La_2O_3$), vanadium(V) oxide ($V_2O_5$), molybdenum(VI) oxide ($MoO_3$) and tungsten(VI) oxide ($WO_3$);
the inorganic metal nanoparticles selected from the group consisting of Cu, Ag, Au, Ni, Fe and Co; and
the inorganic semiconductor nanoparticles comprising either plural core-shell nanoparticles having metal oxide shell or plural core solely, and the cores selected from the group consisting of CdSe, $Cd_xZn_{1-x}Se$ ($0.01 \leq x \leq 0.99$), $Cd_xZn_{1-x}S$ ($0.01 \leq x \leq 0.99$), $Cd_xZn_{1-x}S_ySe_{1-y}$ ($0.01 \leq x \leq 0.99$ and $0.01 \leq y \leq 0.99$), CdSe—ZnS, CdSe—CdTe, CdTe, CdS, CdS—ZnS, CdSe—CdTe—ZnSe, ZnS, ZnTe, PbS, PbSe, PbTe, ZnO, and Si.

34. The method according to claim 32, wherein the functional groups of the surface modifier are selected from the group consisting of 3-methacryloxypropyltrimethoxysilane, 3-glycidoxypropyltrimethoxysilane triethoxyvinylsilane, vinyl tris(2-methoxyethoxy)silane, vinyltrimethoxysilane, vinyltriacetoxysilane, and allyltriethoxysilane.

35. The method according to claim 32, wherein the functional groups of the oligomers are acrylate functional groups.

36. The method according to claim 32, wherein the organic matrix comprises a series of acrylic monomers, comprising at least one of monomers with six functional groups, with five functional groups, with four functional groups, with three functional groups, with two functional groups, and with one functional group, or a combination thereof.

37. The method according to claim 32, wherein the organic matrix is selected from thermally polymerizable monomers and photochemically polymerizable monomers, comprising polymerizable organic monomers, acrylic monomers, organic oligomers, monomers with epoxide groups, and silicone.

38. The method according to claim 37, wherein a curing (/hardening) agent is further added into the mixture before curing the mixture to solidify the organic matrix.

39. The method according to claim 32, is applicable in a thin film and sheet fabrication, a device package fabrication, or an optical device fabrication.

40. The method according to claim 32, is applicable in a light emitting diode (LED) package fabrication to form a LED package with gradient refraction index.

41. A method of manufacturing gradient composite material, comprising:
providing plural surface modified inorganic nanoparticles with functional groups or oliqomers with functional groups, and the surface modified inorganic nanoparticles comprising at least one kind of metal oxide nanoparticles, metal nanoparticles and semiconductor nanoparticles;
transferring the surface modified inorganic nanoparticles with functional groups or oliqomers with functional groups into an organic matrix to form a mixture;
performing a gradient step, comprising a photo-polymerization step or a thermo-polymerization step for polymerizing and generating a gradient distribution of the surface modified inorganic nanoparticles with functional groups or oliqomers with functional groups in the mixture; and
curing the mixture to solidify the organic matrix and form a structure with gradient composite, wherein the organic matrix is transferred into an organic polymer after curing;

wherein the organic matrix is selected from thermally polymerizable monomers or photochemically polymerizable monomers;

wherein the surface modified inorganic nanoparticles with functional groups possess the photochemically polymerizable functional groups, and a first light source for performing the photo polymerization has a first wavelength and a first power, and a second light source for curing the mixture has a second wavelength and a second power, wherein the second wavelength is different from the first wavelength, or the second power is larger than the first power while the first and second wavelengths are equal.

42. The method according to claim 41, wherein the functional groups of the surface modifier are selected from the group consisting of photochemically polymerizable organic functional groups, acrylic functional groups, and epoxide groups.

* * * * *